(12) United States Patent
Choi et al.

(10) Patent No.: US 12,430,078 B2
(45) Date of Patent: Sep. 30, 2025

(54) MEMORY SYSTEM AND MEMORY CONTROLLER THAT TRANSMITS COMMANDS TO MEMORY DEVICES AND OPERATING METHOD THEREOF

(71) Applicant: Samsung Electronics Co., Ltd., Suwon-si (KR)

(72) Inventors: Kyungeun Choi, Suwon-si (KR); Wooseong Cheong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/466,255

(22) Filed: Sep. 13, 2023

(65) Prior Publication Data
US 2024/0184487 A1 Jun. 6, 2024

(30) Foreign Application Priority Data
Dec. 1, 2022 (KR) .................. 10-2022-0165963

(51) Int. Cl.
G06F 12/00 (2006.01)
G06F 3/06 (2006.01)

(52) U.S. Cl.
CPC .......... *G06F 3/0659* (2013.01); *G06F 3/0658* (2013.01); *G06F 3/0622* (2013.01); *G06F 3/0683* (2013.01)

(58) Field of Classification Search
None
See application file for complete search history.

(56) References Cited

U.S. PATENT DOCUMENTS

| | | |
|---|---|---|
| 7,565,480 B2 | 7/2009 | Perego |
| 8,358,554 B2 | 1/2013 | Kim et al. |
| 9,286,965 B2 | 3/2016 | Perego et al. |
| 10,885,967 B2 | 1/2021 | Rehmeyer et al. |
| 2001/0008496 A1 | 7/2001 | Leung |
| 2013/0100755 A1 | 4/2013 | Youn et al. |
| 2017/0062038 A1 | 3/2017 | Doo et al. |
| 2017/0110178 A1 | 4/2017 | Bains |
| 2022/0270662 A1 | 8/2022 | Kang et al. |

FOREIGN PATENT DOCUMENTS

KR  101377306 B1  3/2014

OTHER PUBLICATIONS

European Search Report issued in corresponding European Application No. 23205865.1 (mailed May 4, 2024).

*Primary Examiner* — Daniel D Tsui
(74) *Attorney, Agent, or Firm* — Wolf, Greenfield & Sacks, P.C.

(57) ABSTRACT

Provided are a memory system and an operating method of the memory system. The memory system includes a memory controller configured to generate a first command and a second command in response to receiving a sequential command from a host, and a first memory device and a second memory device each configured to receive the first command and the second command, wherein the sequential command is a command to determine or indicates whether to access each of the first memory device and the second memory device, and the memory controller is further configured to determine whether to access at least one memory device among the first and second memory devices, transmit the first command to the first memory device when the first memory device is to be accessed, and transmit the second command to the second memory device when the second memory device is not to be accessed.

20 Claims, 26 Drawing Sheets

FIG. 6

|   | 1st MEMORY DEVICE /221 | | 2nd MEMORY DEVICE /222 | |
|---|---|---|---|---|
|   | CMD | EN | CMD | EN |
| 1 | CMD1 | enable | CMD2 | enable |
| 2 | CMD1 | disable | CMD2 | enable |
| 3 | CMD1 | enable | CMD2 | disable |
| 4 | CMD1 | disable | CMD2 | disable |
| 5 | CMD2 | enable | CMD1 | enable |
| 6 | CMD2 | disable | CMD1 | enable |
| 7 | CMD2 | enable | CMD1 | disable |
| 8 | CMD2 | disable | CMD1 | disable |

CMD1 : CMD_W, CMD_R
CMD2: enter_CMD, exit_CMD

FIG. 16

| | 1st MEMORY DEVICE (321) | | 2nd MEMORY DEVICE (322) | |
|---|---|---|---|---|
| | CMD | EN | CMD | EN |
| 1 | CMD1 | enable | CMD1 | enable |
| 2 | CMD1 | disable | CMD1 | enable |
| 3 | CMD1 | enable | CMD1 | disable |
| 4 | CMD1 | disable | CMD1 | disable |
| 5 | CMD2 | enable | CMD2 | enable |
| 6 | CMD2 | disable | CMD2 | enable |
| 7 | CMD2 | enable | CMD2 | disable |
| 8 | CMD2 | disable | CMD2 | disable |

CMD1 : CMD_W, CMD_R
CMD2: enter_CMD, exit_CMD

MEMORY SYSTEM AND MEMORY CONTROLLER THAT TRANSMITS COMMANDS TO MEMORY DEVICES AND OPERATING METHOD THEREOF

CROSS-REFERENCE TO RELATED APPLICATION

This application is based on and claims priority under 35 U.S.C. § 119 to Korean Patent Application No. 10-2022-0165963, filed on Dec. 1, 2022, in the Korean Intellectual Property Office, the disclosure of which is incorporated by reference herein in its entirety.

FIELD

The inventive concept relates to a memory system, and more particularly, to a memory system which performs a refresh operation, and an operating method of the memory system.

BACKGROUND

The capacity and speed of memory devices used in high-performance electronic systems have been increased. Dynamic random access memory (DRAM), as an example of a memory device, is volatile memory wherein data is determined by charges stored in a capacitor.

Along with the increasing degree of integration of memory devices, the time periods for which memory cells may retain data may decrease, and to prevent loss of data, various types of refresh designs may be used for memory devices. However, there may be a limit in preventing data loss of memory cells due to various factors based on general refresh designs.

SUMMARY

Embodiments of the inventive concept provide a memory system with reduced power consumption by allowing the necessity of a refresh operation to be determined for each memory device and allowing each memory device to optimally perform a refresh operation, a read operation, and/or a write operation, and an operating method of the memory system.

According to an aspect of the inventive concept, a memory system includes a memory controller configured to generate a first command and a second command in response to receiving a sequential command from a host, and a first memory device and a second memory device each configured to receive the first command or the second command from the memory controller, wherein the sequential command indicates whether to access each of the first memory device and the second memory device, and the memory controller is further configured to determine whether to access at least one memory device among the first and second memory devices, transmit the first command to the first memory device responsive to determining that the first memory device is to be accessed, and transmit the second command to the second memory device responsive to determining that the second memory device is not to be accessed.

According to another aspect of the inventive concept, a memory system includes a memory controller, which is configured to generate a first command and a second command in response to receiving a sequential command from a host, and a first memory device and a second memory device each configured to receive the first command and the second command, wherein the sequential command is a command to determine whether to access each of the first memory device and the second memory device, and the memory controller is further configured to determine whether to access at least one memory device, transmit the first command to the first memory device when the first memory device and the second memory device are accessed, and transmit the second command to the second memory device when the first memory device and the second memory device are not accessed.

According to still another aspect of the inventive concept, an operating method of a memory system includes receiving, from a host, a sequential command to refresh a sequence of a memory device; determining whether to access at least one memory device among a first memory device and a second memory device, based on the sequential command that is received from the host; generating a first command and a second command, based on the sequential command; and transmitting the first command and the second command, which are generated, to a first memory device and a second memory device, respectively, wherein the first command comprises one of a read command or a write command, and the second command comprises one of a refresh enter command or a refresh exit command.

According to yet another aspect of the inventive concept, an operating method of a memory system includes receiving, from a host, a sequential command to refresh a sequence of a memory device, determining whether to access at least one memory device among a first memory device and a second memory device, based on the sequential command that is received from the host, generating a first command and a second command, based on the sequential command, and transmitting the first command and the second command, which are generated, to a first memory device and a second memory device, wherein the first command includes one of a read command or a write command, and the second command includes one of a refresh enter command or a refresh exit command.

BRIEF DESCRIPTION OF THE DRAWINGS

Embodiments will be more clearly understood from the following detailed description taken in conjunction with the accompanying drawings in which:

FIG. 6 is a table illustrating an operating method of a memory device, according to some embodiments;

FIG. 16 is a table illustrating an operating method of a memory device, according to some embodiments;

DETAILED DESCRIPTION OF EMBODIMENTS

Hereinafter, embodiments of the inventive concept will be described in detail with reference to the accompanying drawings. The terms "comprises," "comprising," "includes" and/or "including," when used herein, specify the presence of stated elements, but do not preclude the presence of additional elements. The term "and/or" includes any and all combinations of one or more of the associated listed items.

Figure 1:
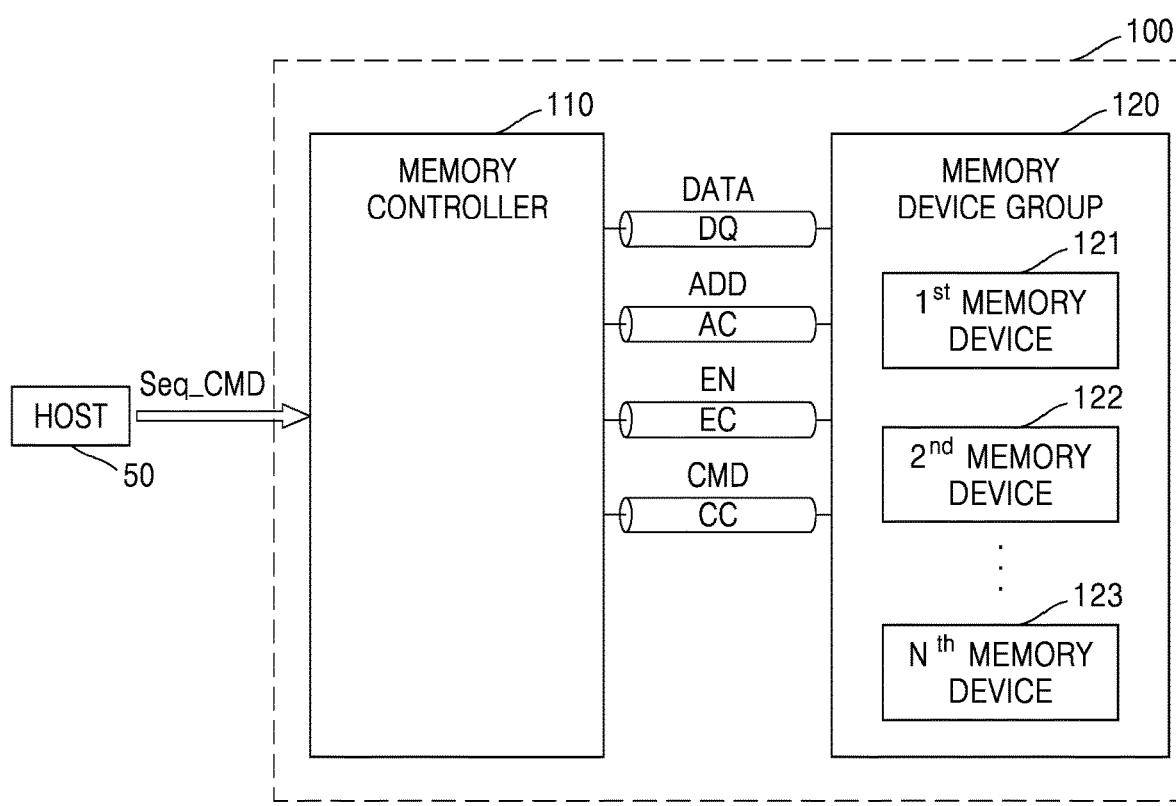
FIG. 1 is a diagram illustrating a system according to some embodiments.

FIG. 1 is a diagram illustrating a system 10 according to some embodiments.

Referring to FIG. 1, the system 10 may include a host 50 and a memory system 100.

The host 50 may be a functional block performing a general computer operation. The host 50 may correspond to a central processing unit (CPU), a digital signal processor (DSP), a graphics processing unit (GPU), a processor, or an application processor (AP).

The host 50 may communicate with the memory system 100 by using an interface protocol, such as Peripheral Component Interconnect-Express (PCI-E), Serial ATA (SATA), Parallel ATA (PATA), or serial attached SCSI (SAS). The interface protocol is not limited to the examples set forth above and may be one of other interface protocols, such as Universal Serial Bus (USB), Multi-Media Card (MMC), Enhanced Small Disk Interface (ESDI), or Integrated Drive Electronics (IDE).

The host 50 may issue or generate request signals for accessing the memory system 100. For example, the host 50 may generate data to be stored in the memory system 100, a command, a random command, a logical address corresponding to a physical address representing a storage space of the memory system 100, and the like.

In some embodiments, the host 50 may transmit a sequential command Seq_CMD to the memory system 100. The sequential command Seq_CMD is a command that may determine or indicate whether to access a plurality of memory devices of a memory device group 120. For example, the sequential command Seq_CMD may be a command to refresh a sequence of a memory device (e.g., a row of the memory device). The memory system 100 may determine memory devices to be accessed and memory devices not to be accessed, based on the sequential command Seq_CMD. In this case, the memory system 100 may generate a read command, a write command, a refresh enter command, and a refresh exit command, based on the sequential command Seq_CMD.

The memory system 100 may perform a data read or write operation or a refresh operation for each memory device, in response to the sequential command Seq_CMD. The memory system 100 may include a memory controller 110 and a memory device group 120. The memory device group 120 may include n or more memory devices (where n is a natural number of 2 or more). The memory device group 120 may include a first memory device 121, a second memory device 122, . . . , and an n-th memory device 123. The terms "first," "second," etc., may be used herein merely to distinguish one component, layer, direction, etc. from another.

The memory controller 110 may control overall operations of the memory system 100. The memory controller 110 may control overall data exchange between the host 50 and the memory device group 120. For example, the memory controller 110 may write or read data by controlling the memory device group 120 according to a request from the host 50. In addition, the memory controller 110 may issue (generate) a command CMD and an address ADD for controlling the memory device group 120.

In some embodiments, the memory controller 110 may issue the command CMD to the memory device group 120. Here, the command CMD may include commands for normal operations, such as data writing and reading, of the memory device group 120. In addition, when the memory device group 120 includes dynamic random access memory (DRAM) cells, the command CMD may include commands for various unique operations related to DRAM, for example, a refresh command for refreshing memory cells. The refresh command may include a refresh enter command and/or a refresh exit command. For example, the refresh command may include a refresh enter command. As another example, the refresh command may include a refresh exit command.

The memory device group 120 may store data or output stored data. A plurality of memory devices 121 to 123 of the memory device group 120 may each be implemented by DRAM. However, the inventive concept is not limited thereto. The plurality of memory devices 121 to 123 may each include DRAM, such as Double Data Rate Synchronous Dynamic Random Access Memory (DDR SDRAM), Low Power Double Data Rate (LPDDR) SDRAM, Graphics Double Data Rate (GDDR) SDRAM, or Rambus Dynamic Random Access Memory (RDRAM).

The memory device group 120 may include one memory chip or may include a semiconductor package including two or more memory chips. In addition, the memory device group 120 may include a memory module in which a plurality of memory chips are mounted on a module board. Alternatively, although FIG. 1 illustrates that the memory controller 110 and the memory device group 120 are separate components from each other, the memory device group 120 of the inventive concept may be implemented by a memory system in which a memory control function and a memory cell array are integrated into one semiconductor package.

According to the descriptions above, the host 50 transmits the sequential command Seq_CMD to the memory system 100, whereby the memory system 100 may determine whether to access each memory device. A memory device that is accessed may perform a data read or write operation, and a memory device that is not accessed may perform or exit a refresh operation by determining whether to perform or exit the refresh operation.

That is, the memory system 100 according to the inventive concept may determine whether to access each memory device, in response to receiving the sequential command Seq_CMD from the host 50, and may perform a refresh operation or a read or write operation on each memory device by determining the necessity of a refresh operation for each memory device, thereby reducing power consumption of the memory system 100.

Figure 2:
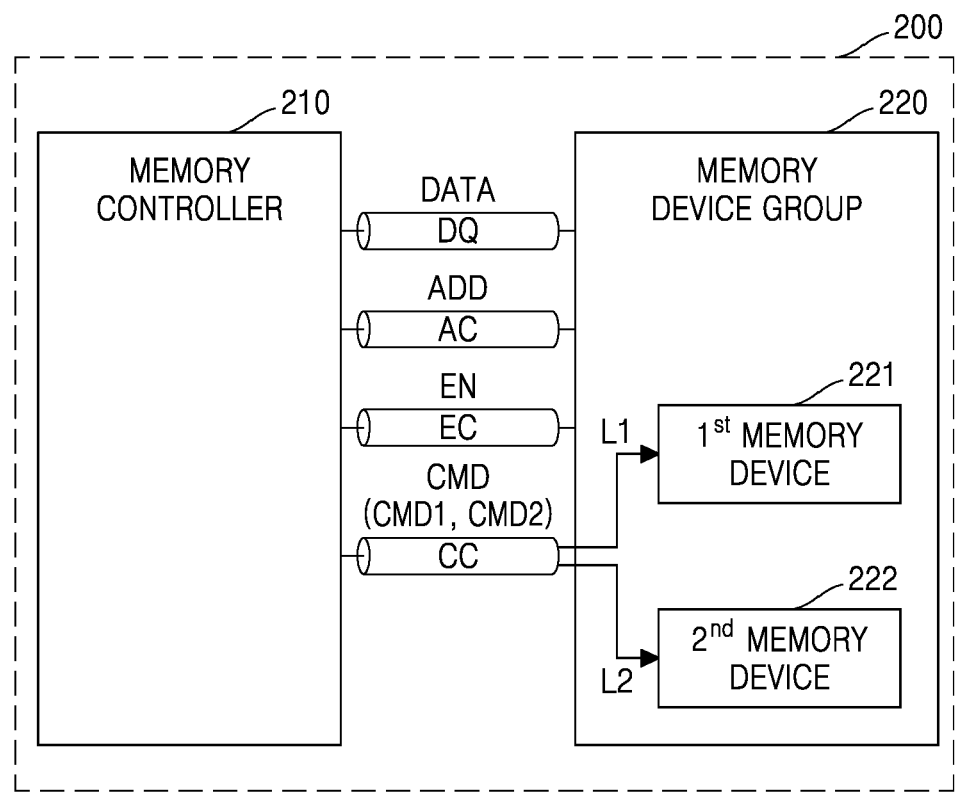
FIG. 2 is a diagram illustrating a memory system according to some embodiments.

FIG. 2 is a diagram illustrating a memory system 200 according to some embodiments.

Referring to FIG. 2, the memory system 200 may correspond to the memory system 100 shown in FIG. 1. The memory system 200 may include a memory controller 210 and a memory device group 220. The memory device group 220 may include a first memory device 221 and a second memory device 222.

The memory controller 210 and the memory device group 220 may be electrically connected to each other via a command channel CC, an address channel AC, a data channel DQ, an enable channel EC, and the like, which correspond thereto. Channels (that is, CC, AC, DQ, and EC) may each be used exclusively for transferring a specific type of information. The channels (that is, CC, AC, DQ, and EC) may be implemented according to double data rate (DDR) standards. For example, the channels (that is, CC, AC, DQ, and EC) may satisfy DDR SDRAM standards determined by Joint Electron Device Engineering Council (JEDEC).

The command channel CC may be configured to communicate a command between the memory controller 210 and each of the first memory device 221 and the second memory device 222. The command may include a read command, a write command, a refresh enter command, a refresh exit command, or the like. The address channel AC may be configured to communicate an address between the memory controller 210 and each of the first memory device 221 and the second memory device 222. The enable channel EC is a channel that may perform a function, such as enable or disable, between first memory device 221 and the second memory device 222.

The data channel DQ may be configured to communicate data and/or control information between the memory controller 210 and the memory device group 220. For example, the data channel DQ may be of an ×4 type (for example, including 4 signal paths), an ×8 type (for example, including 8 signal paths), an ×16 type (including 16 signal paths), or the like. A signal communicated through the data channel DQ may be used as a DDR signal. The data channel DQ may be a bidirectional communication channel. The bidirectional communication channel may refer to a channel through which the memory controller 210 may transmit data to the memory device group 220 and the memory device group 220 may also transmit data to the memory controller 210.

The memory controller 210 may correspond to the memory controller 110 shown in FIG. 1. The memory device group 220 may correspond to the memory device group 120 shown in FIG. 1. The first memory device 221 may correspond to the first memory device 121 shown in FIG. 1. The second memory device 222 may correspond to the second memory device 122 shown in FIG. 1.

The memory controller 210 may transmit a first command CMD1, a second command CMD2, and/or an enable signal EN to each of the first memory device 221 and the second memory device 222 and thus access data of each of the first memory device 221 and the second memory device 222. The first command CMD1 may include commands for normal memory operations, such as a data read command and a data write command. The second command CMD2 may include a refresh enter command for performing a refresh operation and/or a refresh exit command for exiting a refresh operation.

Each of the first memory device 221 and the second memory device 222 may write data thereto or read data therefrom, in response to the first command CMD1. Each of the first memory device 221 and the second memory device 222 may perform or exit a refresh operation, in response to the second command CMD2. The refresh operation may include an operation of reading data stored in a cell and an operation of storing (or recharging or writing) the read data again, for memory cells (or a memory cell row) corresponding to a refresh row address. Each of the first memory device 221 and the second memory device 222 may write, thereto again, the same data as stored data that is read, by performing a refresh operation.

The first memory device 221 may receive a command generated by the memory controller 210, through a first line L1, and the second memory device 222 may receive a command generated by the memory controller 210, through a second line L2 that is different from the first line L1.

For example, the first memory device 221 may receive the first command CMD1 generated by the memory controller 210, through the first line L1, and the second memory device 222 may receive the second command CMD2 generated by the memory controller 210, through the second line L2. This is described below in detail with reference to FIG. 7.

Conversely, for example, the first memory device 221 may receive the second command CMD2 generated by the memory controller 210, through the first line L1, and the second memory device 222 may receive the first command CMD1 generated by the memory controller 210, through the second line L2. This is described below in detail with reference to FIG. 11.

For example, the first memory device 221 may receive the second command CMD2 generated by the memory controller 210, through the first line L1, and the second memory device 222 may receive the first command CMD1 generated by the memory controller 210, through the second line L2.

As another example, the first memory device 221 may receive the second command CMD2 generated by the memory controller 210, through the first line L1, and the second memory device 222 may receive the second command CMD2 generated by the memory controller 210, through the second line L2.

According to the descriptions above, the memory system 200 according to the inventive concept may determine whether to access each memory device, in response to receiving a sequential command from a host, and may perform a refresh operation or a read or write operation on each memory device by determining the necessity of a refresh operation for each memory device, thereby reducing power consumption of the memory system 200.

Figure 3:
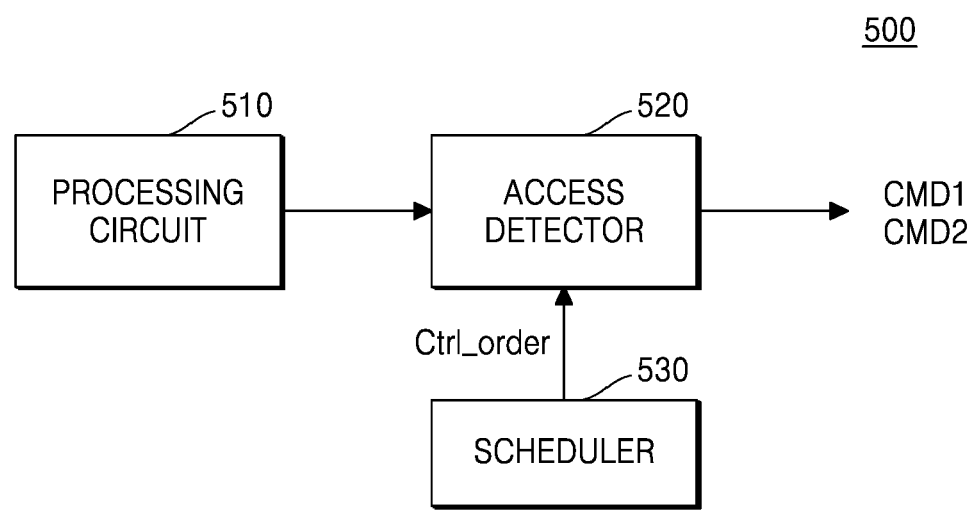
FIG. 3 is a diagram illustrating a memory controller according to some embodiments.

FIG. 3 is a diagram illustrating a memory controller 500 according to some embodiments.

As shown in FIG. 3, the memory controller 500 may include a processing unit or processing circuit 510, an access detector 520, and a scheduler 530. The memory controller 500 may correspond to the memory controller 110 shown in FIG. 1.

Although not shown in FIG. 3, the memory controller 500 may further include other various functional blocks for controlling a memory device. In addition, the functional blocks of the memory controller 500 shown in FIG. 3 and signal transmission and reception relationships thereof are only an example, and even when the various functional blocks and the signal transmission and reception relationships thereof are modified, various functions according to embodiments of the inventive concept may be performed.

Referring to FIG. 3, the processing unit 510 may control overall operations of the memory controller 500 and thus control various functional blocks in the memory controller 500. The processing unit 510 may be referred to as a processor.

The access detector 520 may detect (determine) whether to access memory devices and which memory devices to access. The access detector 520 may generate a command according to an access request from a host (e.g., the host 50), for example, may generate the first command CMD1 according to a result of decoding a packet from the host. The first command CMD1 may include a write command and a read command, which may write data to and read data from a memory device, respectively. The access detector 520 may generate a refresh command, for example, the second command CMD2, when no access is made by the host (a non-access request). The second command CMD2 may include a refresh enter command and/or a refresh exit command, which may perform or exit a refresh operation on a memory device.

The first command CMD1 and the second command CMD2, which are generated by the access detector 520, may be stored in a command queue. The command queue may sequentially store the first command CMD1 and the second command CMD2 therein, according to the order of commands that are input. A command stored in the command queue may undergo an adjustment of output thereof, according to a certain order control signal Ctrl_order. The order control signal Ctrl_order may be generated by the scheduler 530.

Referring together to FIGS. 2 and 3, the scheduler 530 may schedule the first command CMD1 and the second command CMD2. The scheduler 530 may adjust output timings of the first command CMD1 and the second command CMD2.

In an embodiment, even when the first command CMD1 is stored later than the second command CMD2, the first command CMD1 may be output earlier than the second command CMD2, which is stored earlier than the first command CMD1, based on the order control signal Ctrl_order. In an embodiment, even when the first command CMD1 is stored later than the second command CMD2, the first command CMD1 and the second command CMD2 may be simultaneously output, based on the order control signal Ctrl_order.

For example, the scheduler 530 may simultaneously transmit the first command CMD1 and/or the second command CMD2 to the first memory device 221 and the second memory device 222. As another example, the scheduler 530 may sequentially transmit the first command CMD1 and/or the second command CMD2 to the first memory device 221 and the second memory device 222, based on the order control signal Ctrl_order.

Figure 4:
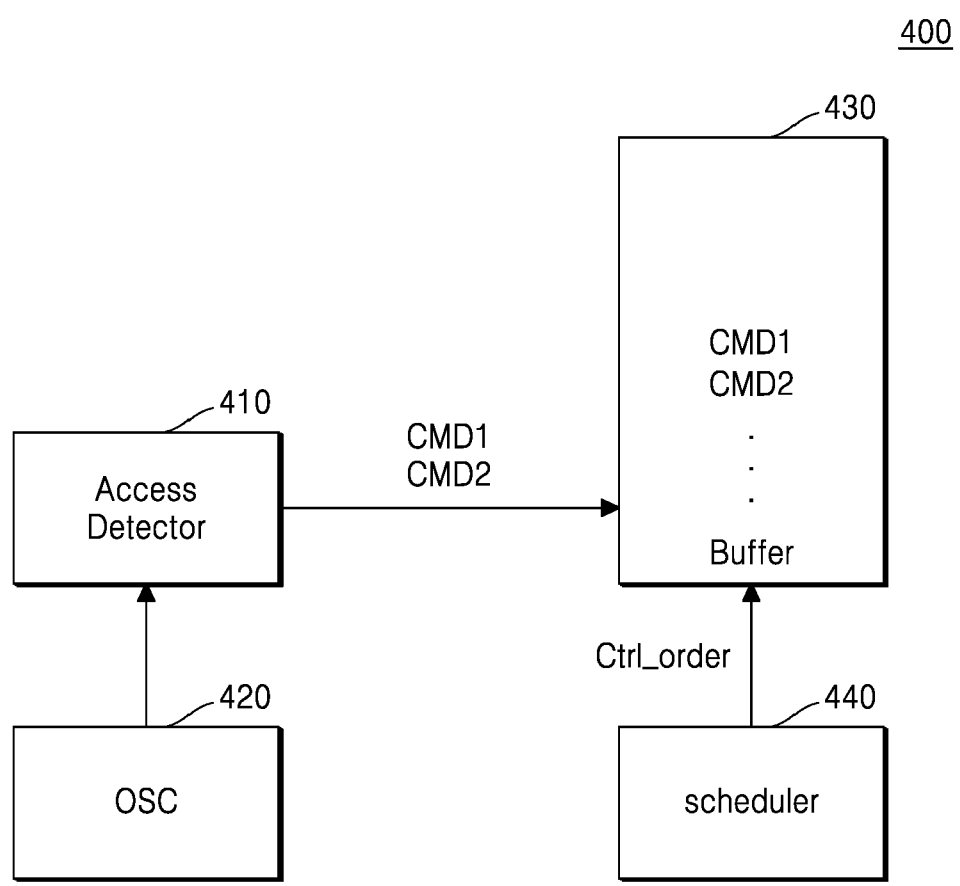
FIG. 4 is a diagram illustrating a memory controller according to some embodiments.

FIG. 4 is a diagram illustrating a memory controller 400 according to some embodiments.

As shown in FIG. 4, the memory controller 400 may include an access detector 410, a buffer 430, and a scheduler 440. The memory controller 400 may correspond to the memory controller 110 shown in FIG. 1. Because FIG. 4 is only another example of the memory controller 500 shown in FIG. 3, repeated descriptions given with reference to FIG. 3 are omitted.

The memory controller 400 may further include an oscillator 420 for generating a signal (for example, a pulse signal) indicating a generation timing of a command. However, this is only an example, and a pulse signal may be transmitted to the memory controller 400 from the oscillator 420 outside the memory controller 400 as the oscillator 420 is arranged outside (e.g., external to) the memory controller 400.

The access detector 410 may generate the first command CMD1 and the second command CMD2, based on the signal from the oscillator 420. The first command CMD1 and the second command CMD2 may be stored in the buffer 430. The scheduler 440 may adjust output timings of commands stored in the buffer 430, by generating the order control signal Ctrl_order.

Referring together to FIGS. 2 and 4, the commands stored in the buffer 430 may be output to the first memory device 221 and the second memory device 222, based on the order control signal Ctrl_order. According to an embodiment, a time period taken for the memory controller 400 to output the first command CMD1 and/or the second command CMD2 may be defined by a specification or "spec." The memory controller 400 may adjust an output timing of the first command CMD1 and/or the second command CMD2 to satisfy the spec.

For example, the scheduler 440 may simultaneously transmit the first command CMD1 and/or the second command CMD2 to the first memory device 221 and the second memory device 222. As another example, the scheduler 440 may sequentially transmit the first command CMD1 and/or the second command CMD2 to the first memory device 221 and the second memory device 222, based on the order control signal Ctrl_order.

Figure 5:
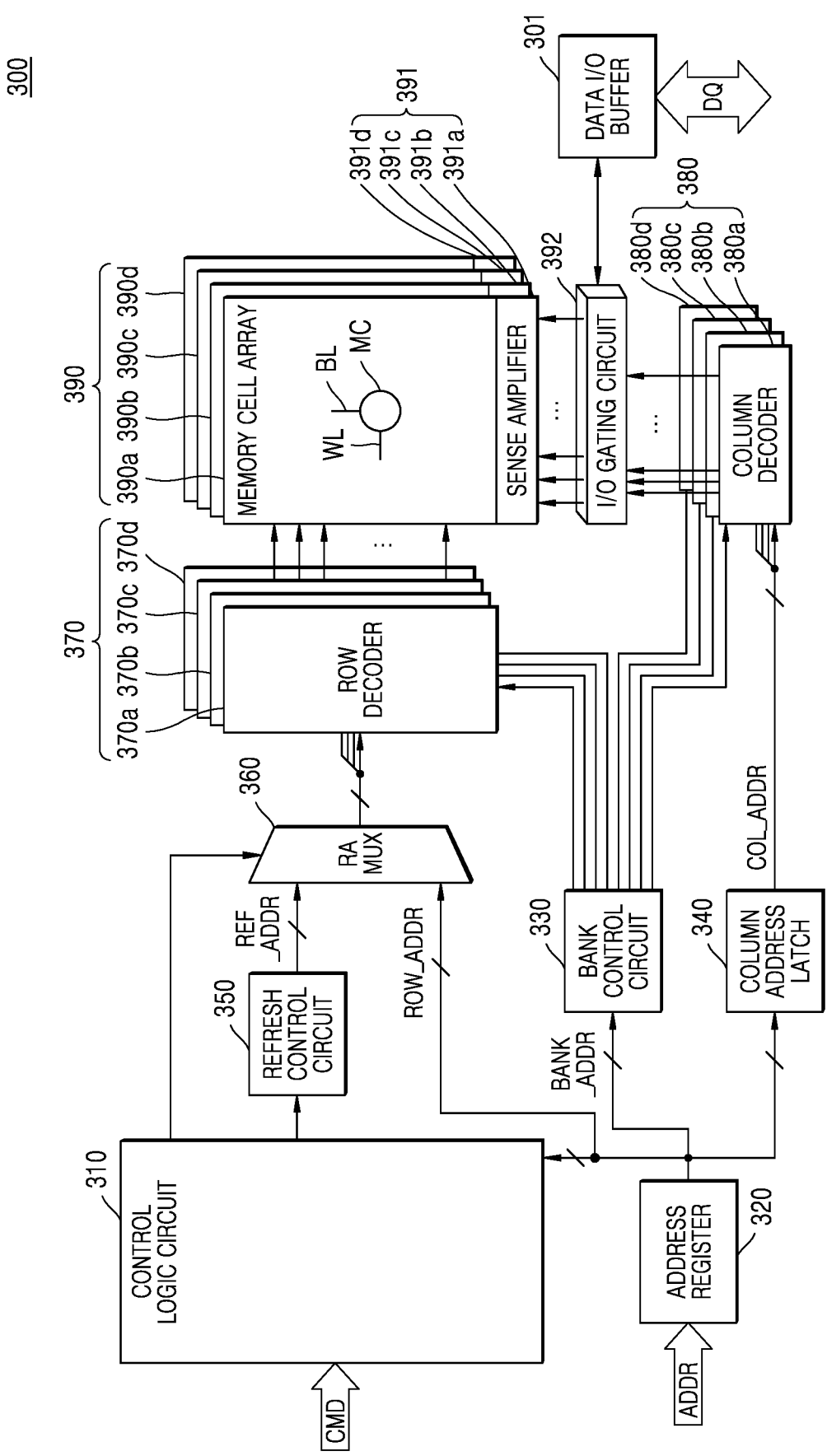
FIG. 5 is a diagram illustrating a memory device according to some embodiments.

FIG. 5 is a diagram illustrating a memory device 300 according to some embodiments.

Referring to FIG. 5, the memory device 300 may correspond to each of the memory devices 121, 122, and 123 shown in FIG. 1. In addition, the memory device 300 may correspond to each of the memory devices 221 and 222 shown in FIG. 2. The memory device 300 may include a control logic circuit 310, an address register 320, a bank control circuit 330, a column address latch 340, a refresh control circuit 350, a row address multiplexer 360, a row decoder 370, a column decoder 380, a memory cell array 390, a sense amplifier 391, an input/output gating circuit 392, and a data input/output buffer 301.

The memory cell array 390 may include first to fourth bank arrays 390a to 390d. Each of the first to fourth bank arrays 390a to 390d may include a memory cell MC, which is formed at an intersection point between a word line WL and a bit line BL. The number of memory cells MC may be a plural number. Each of the first to fourth bank arrays 390a to 390d may include a plurality of pages each including a memory cell row connected to each word line WL.

The row decoder 370 may include first to fourth bank row decoders 370a to 370d respectively connected to the first to fourth bank arrays 390a to 390d.

The column decoder 380 may include first to fourth bank column decoders 380a to 380d respectively connected to the first to fourth bank arrays 390a to 390d.

The sense amplifier 391 may include first to fourth bank sense amplifiers 391a to 391d respectively connected to the first to fourth bank arrays 390a to 390d.

The first to fourth bank arrays 390a to 390d, the first to fourth bank sense amplifiers 391a to 391d, the first to fourth bank column decoders 380a to 380d, and the first to fourth bank row decoders 370a to 370d may constitute first to fourth banks, respectively. Although FIG. 5 illustrates the memory cell array 390 including four banks, the inventive concept is not limited thereto. According to some embodiments, the memory cell array 390 may include any number of banks.

The address register 320 may transmit an address ADDR including a bank address BANK_ADDR, a row address ROW_ADDR, and a column address COL_ADDR. The address register 320 may transmit the bank address BANK_ADDR to the bank control circuit 330. The address register 320 may transmit the row address ROW_ADDR to the row address multiplexer 360. The address register 320 may transmit the column address COL_ADDR to the column address latch 340.

The bank control circuit 330 may generate bank control signals in response to the bank address BANK_ADDR. The bank control signals may be transmitted to the first to fourth bank row decoders 370a to 370d and the first to fourth bank column decoders 380a to 380d. A bank row decoder corresponding to the bank address BANK_ADDR, from among the first to fourth bank row decoders 370a to 370d, may be activated. A bank column decoder corresponding to the bank address BANK_ADDR, from among the first to fourth bank column decoders 380a to 380d, may be activated.

The refresh control circuit 350 may generate a refresh row address REF_ADDR for refreshing a plurality of memory cell rows in the memory cell array 390, according to control by the control logic circuit 310. The refresh control circuit 350 may be included in the memory device 300 when memory cells MC of the memory cell array 390 include dynamic memory cells.

The row address multiplexer 360 may receive the row address ROW_ADDR from the address register 320 and may receive the refresh row address REF_ADDR from the refresh control circuit 350. The row address multiplexer 360 may selectively output, as a row address, the row address ROW_ADDR or the refresh row address REF_ADDR. The row address may be applied to each of the first to fourth bank row decoders 370a to 370d.

A bank row decoder activated by the bank control circuit 330, from among the first to fourth bank row decoders 370a to 370d, may activate a word line corresponding to the row address by decoding the row address that is output from the row address multiplexer 360. For example, the activated bank row decoder may apply a drive voltage to the word line corresponding to the row address.

The column address latch 340 may receive the column address COL_ADDR from the address register 320 and may temporarily store the received column address COL_ADDR. In addition, the column address latch 340, in a burst mode, may gradually increase the received column address COL_ADDR. The column address latch 340 may apply the temporarily stored or gradually increased column address COL_ADDR to each of the first to fourth bank column decoders 380a to 380d.

A bank column decoder activated by the bank control circuit 330, from among the first to fourth bank column decoders 380a to 380d, may activate a sense amplifier corresponding to the bank address BANK_ADDR and the column address COL_ADDR through the input/output gating circuit 392.

The input/output gating circuit 392 may include circuits for gating data, input data mask logic, data latches, and write drivers.

Data transmitted to the data input/output buffer 301 may be written to the first to fourth bank arrays 390a to 390d through the write drivers. Data read or written through the data input/output buffer 301 may be input and output in units of bursts.

The control logic circuit 310 may control overall operations of the memory device 300. For example, the control logic circuit 310 may generate control signals indicating to perform a write operation or a read operation. As another example, the control logic circuit 310 may generate control signals indicating to perform a refresh operation.

FIG. 6 is a table illustrating an operating method of the first memory device 221 and the second memory device 222, according to some embodiments. FIGS. 7 to 10 are diagrams illustrating an operating method of the first memory device 221 and the second memory device 222, when the first memory device 221 receives the first command CMD1 and the second memory device 222 receives the second command CMD2, according to some embodiments.

First, referring to FIG. 6, each of the first memory device 221 and the second memory device 222 may perform a data read operation, a data write operation, a refresh operation mode enter operation, or a refresh operation mode exit operation, depending on the type of received command and the type of enable signal.

FIG. 6 illustrates an operating method of the first memory device 221 and the second memory device 222, when the first memory device 221 and the second memory device 222 receive different commands from each other.

For example, when the first memory device 221 is accessed and the second memory device 222 is not accessed, the first memory device 221 may receive the first command CMD1, and the second memory device 222 may receive the second command CMD2. Conversely, when the first memory device 221 is not accessed and the second memory device 222 is accessed, the first memory device 221 may receive the second command CMD2, and the second memory device 222 may receive the first command CMD1.

In addition, each of the first memory device 221 and the second memory device 222 may receive the enable signal EN. For example, when the first memory device 221 receives the enable signal EN, the first memory device 221 may be in an enabled state. On the other hand, when the second memory device 222 does not receive the enable signal EN, the second memory device 222 may be in a disabled state.

Figure 7:
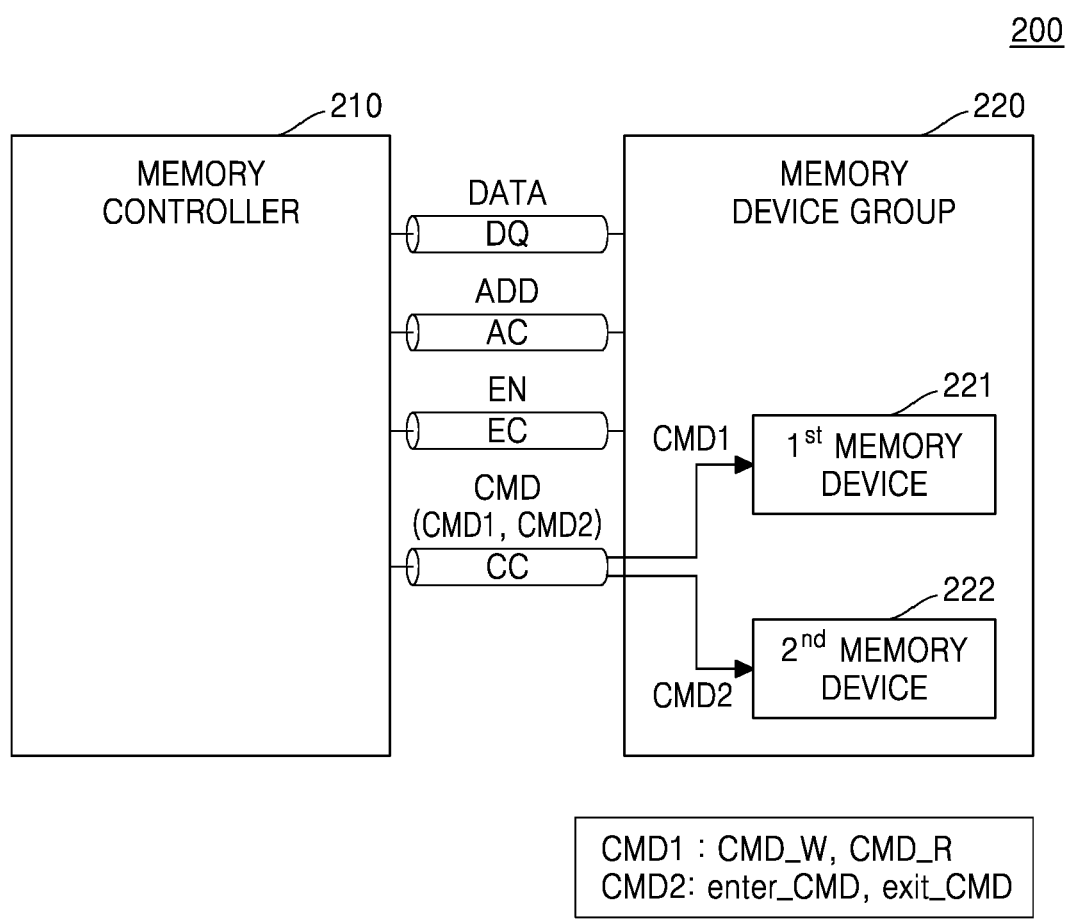
FIGS. 7, 8, 9, and 10 are diagrams illustrating an operating method of a memory device when a first memory device receives a first command and a second memory device receives a second command, according to an embodiment.

Referring together to FIGS. 2 and 7, the first memory device 221 may receive the first command CMD1, which is generated by the memory controller 210, through the first line L1, and the second memory device 222 may receive the second command CMD2, which is generated by the memory controller 210, through the second line L2 that is different from the first line L1.

Figure 8:
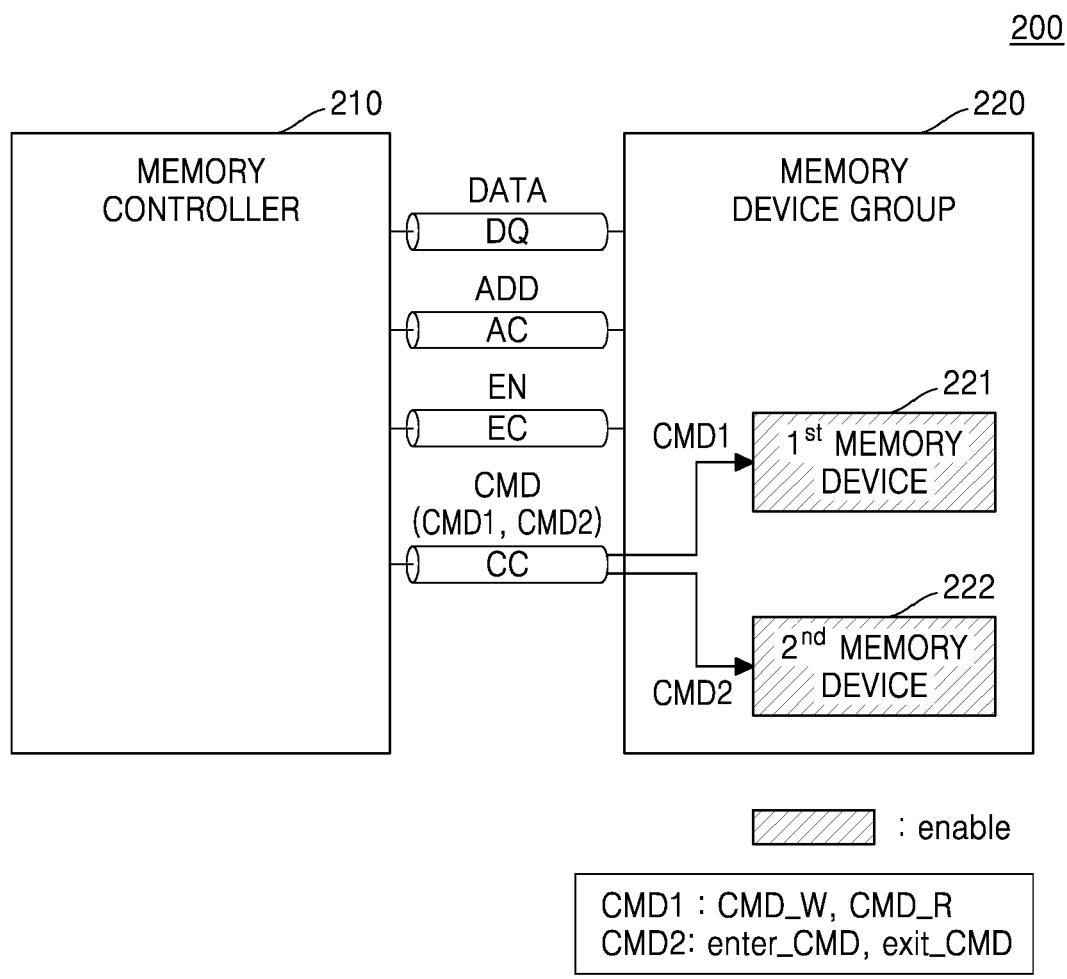

Referring to FIGS. 6 to 8, the first memory device 221 may receive the first command CMD1 and the enable signal EN, and the second memory device 222 may receive the second command CMD2 and the enable signal EN.

For example, referring to FIG. 8, when the first command CMD1 is a read command CMD_R and the second command CMD2 is a refresh enter command enter_CMD, the first memory device 221 may perform a data read operation, and the second memory device 222 may perform a refresh operation.

When the first command CMD1 is a write command CMD_W and the second command CMD2 is a refresh exit command exit_CMD, the first memory device 221 may perform a data write operation, and the second memory device 222 may exit a refresh operation.

When the first command CMD1 is the read command CMD_R and the second command CMD2 is the refresh exit command exit_CMD, the first memory device 221 may perform a data read operation, and the second memory device 222 may exit a refresh operation.

When the first command CMD1 is the write command CMD_W and the second command CMD2 is the refresh enter command enter_CMD, the first memory device 221 may perform a data write operation, and the second memory device 222 may perform a refresh operation.

Figure 9:
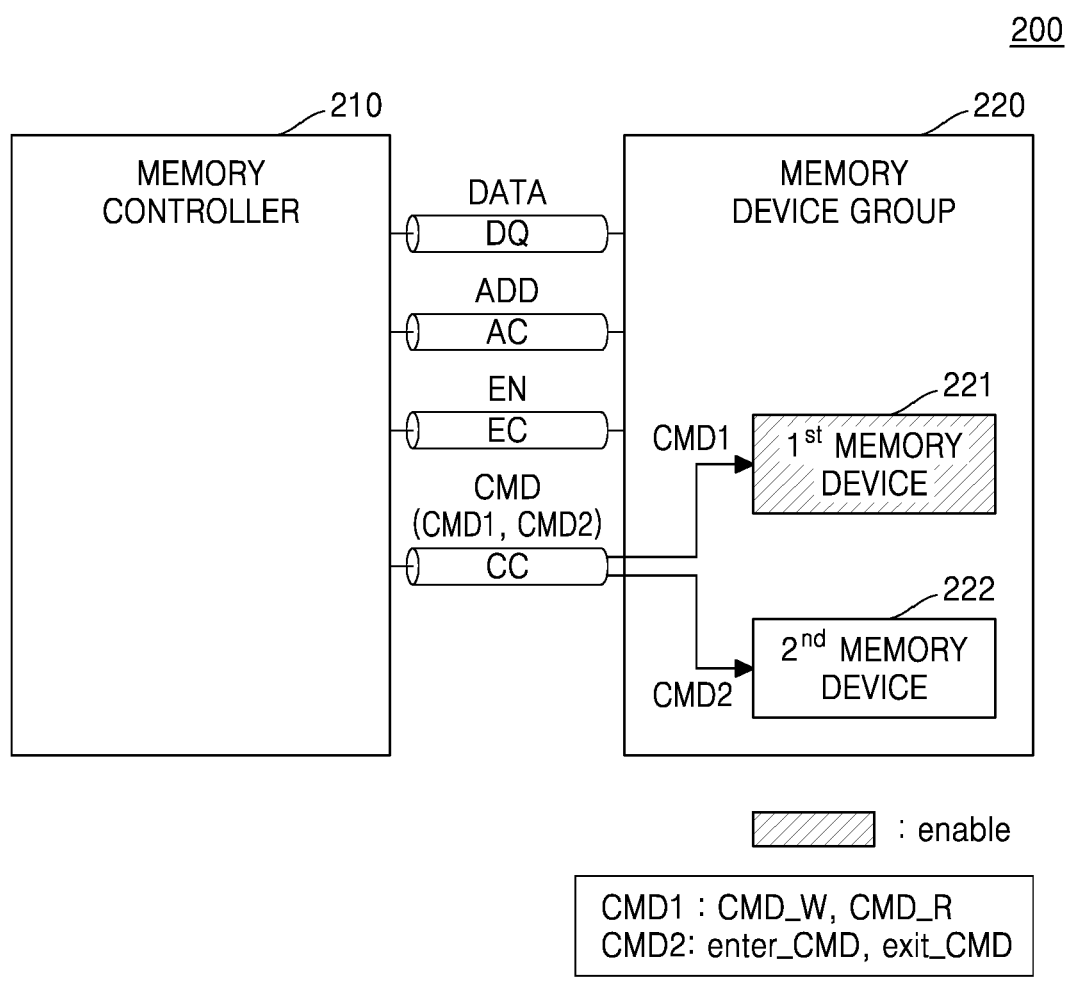

Referring to FIGS. 6, 7, and 9, the first memory device 221 may receive the first command CMD1 and the enable signal EN, and the second memory device 222 may receive only the second command CMD2.

When the second memory device 222 does not receive the enable signal EN, the second memory device 222 may be in a disabled state, and regardless of whether the second command CMD2 is the refresh enter command enter_CMD and/or the refresh exit command exit_CMD, the second memory device 222 may not perform a refresh operation and may not exit a refresh operation.

For example, depending on whether the first command CMD1 is the read command CMD_R or the write command CMD_W, the first memory device 221 may perform a data read operation or a data write operation.

Figure 10:
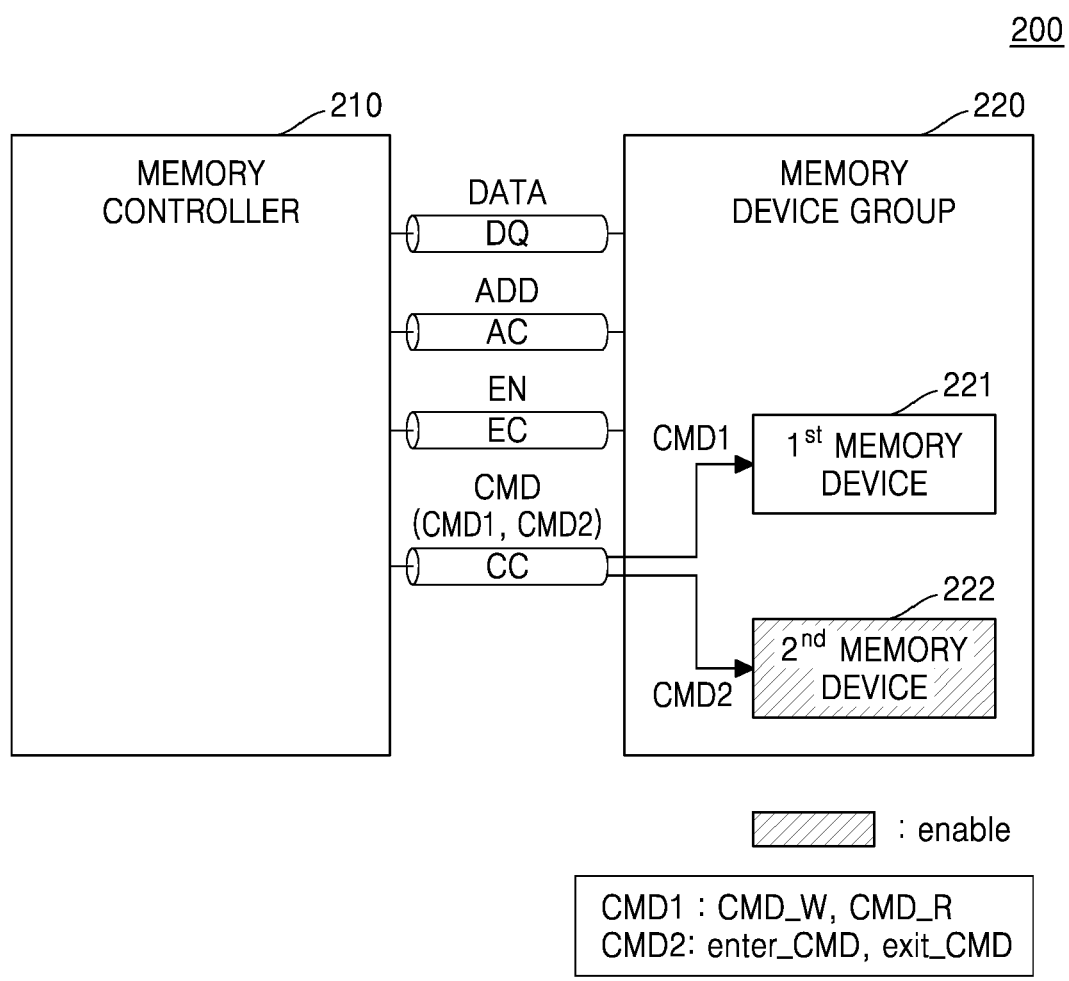

Referring to FIGS. 6, 7, and 10, the first memory device 221 may receive only the first command CMD1, and the second memory device 222 may receive the second command CMD2 and the enable signal EN.

When the first memory device 221 does not receive the enable signal EN, the first memory device 221 may be in a disabled state, and regardless of whether the first command CMD1 is the read command CMD_R and/or the write command CMD_W, the first memory device 221 may not perform a data read operation and/or a data write operation.

For example, depending on whether the second command CMD2 is the refresh enter command enter_CMD or the refresh exit command exit_CMD, the second memory device 222 may perform a refresh operation or may exit a refresh operation.

Referring again to FIG. 7, the first memory device 221 may receive only the first command CMD1, and the second memory device 222 may receive only the second command CMD2. That is, neither the first memory device 221 nor the second memory device 222 receive the enable signal EN.

According to the embodiments described above, the memory system 200 according to the inventive concept may determine whether to access each memory device, in response to receiving a sequential command from a host, and may perform a refresh operation or a read or write operation on each memory device by determining the necessity of a refresh for each memory device, thereby reducing power consumption of the memory system 200.

FIGS. 11 to 14 are diagrams illustrating an operating method of the first memory device 221 and the second memory device 222, when the first memory device 221 receives the second command CMD2 and the second memory device 222 receives the first command CMD1, according to an embodiment.

Figure 11:
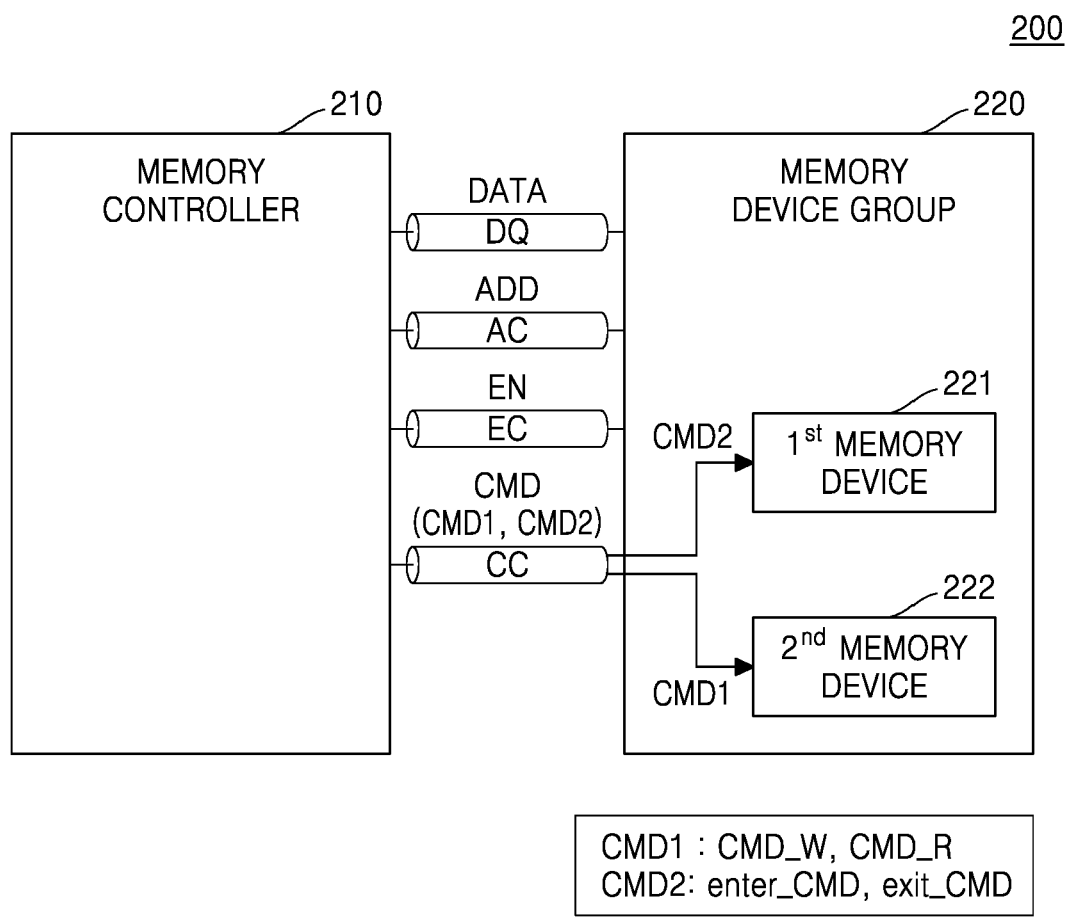
FIGS. 11, 12, 13, and 14 are diagrams illustrating an operating method of a memory device when a first memory device receives a second command and a second memory device receives a first command, according to an embodiment.

Referring together to FIGS. 2 and 11, in contrast to FIG. 7, the first memory device 221 may receive the second command CMD2 generated by the memory controller 210, through the first line L1, and the second memory device 222 may receive the first command CMD1 generated by the memory controller 210, through the second line L2.

Figure 12:
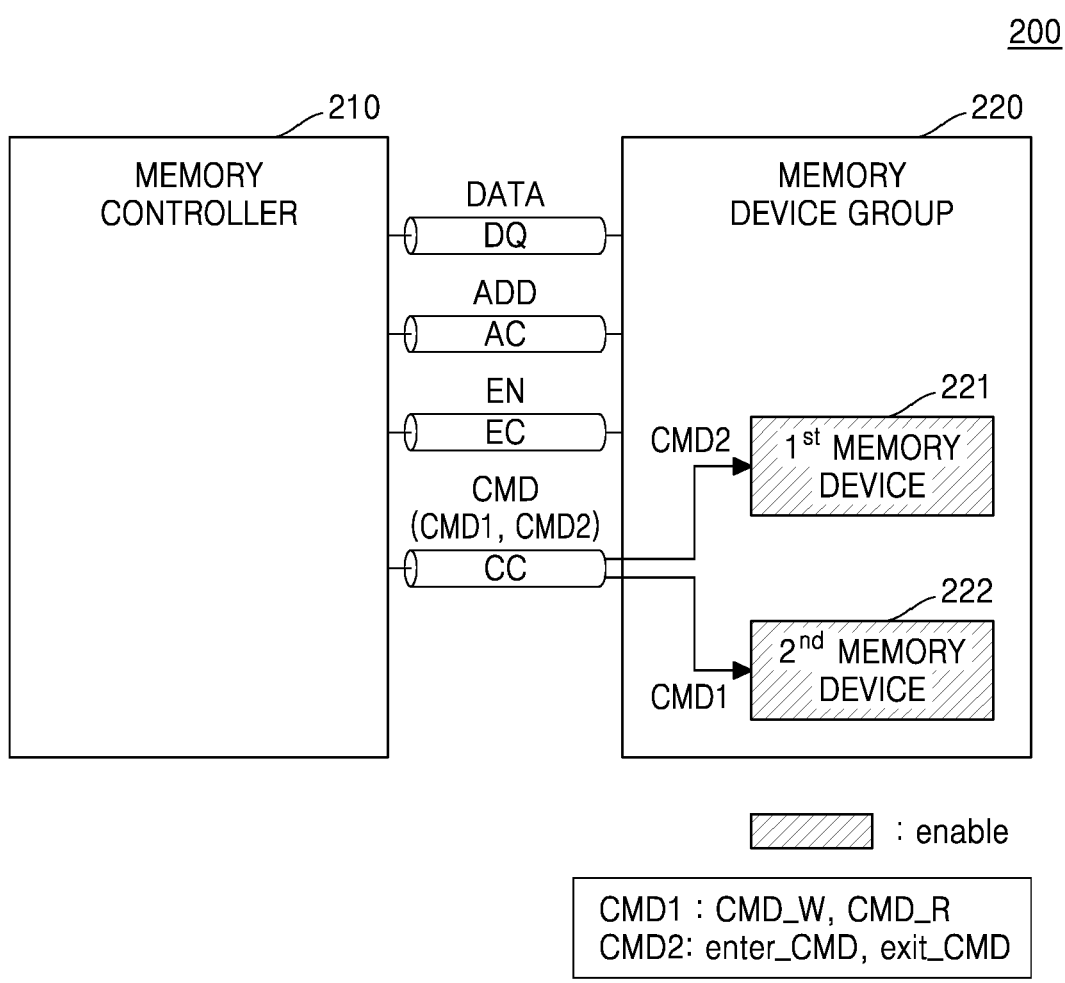

Referring to FIGS. 11 and 12, the first memory device 221 may receive the second command CMD2 and the enable signal EN, and the second memory device 222 may receive the first command CMD1 and the enable signal EN.

Figure 13:
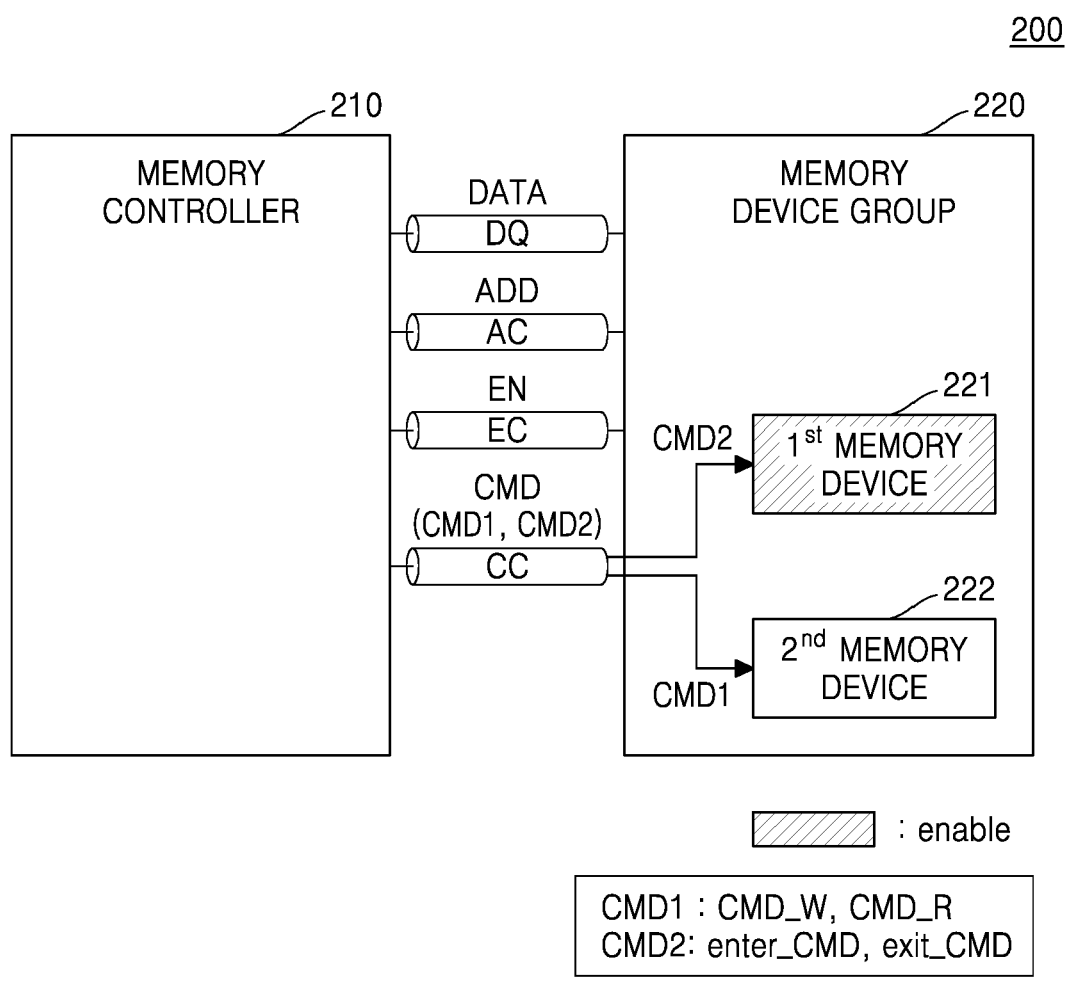

Referring to FIGS. 11 and 13, the first memory device 221 may receive the second command CMD2 and the enable signal EN, and the second memory device 222 may receive only the first command CMD1.

Figure 14:
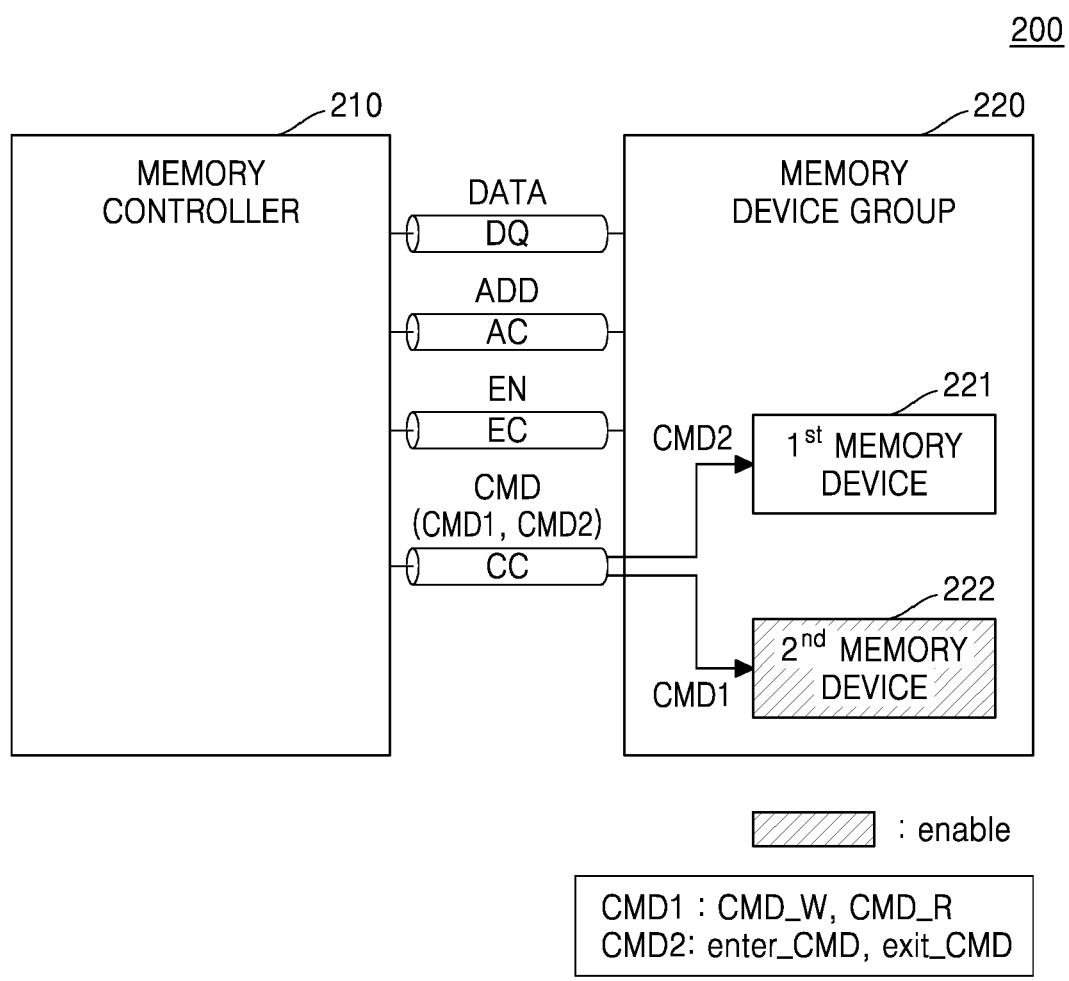

Referring to FIGS. 11 and 14, the first memory device 221 may receive only the second command CMD2, and the second memory device 222 may receive the first command CMD1 and the enable signal EN.

Referring again to FIG. 11, the first memory device 221 may receive only the second command CMD2, and the second memory device 222 may receive only the first command CMD1. The first memory device 221 and the second memory device 222 may not receive the enable signal EN.

In addition, in any of the embodiments, the first memory device 221 and the second memory device 222 may simultaneously or sequentially receive the first command CMD1 and/or the second command CMD2.

According to the embodiments described above, the memory system 200 according to the inventive concept may determine whether to access each memory device, in response to receiving a sequential command from a host, and may perform a refresh operation or a read or write operation on each memory device by determining the necessity of a refresh for each memory device, thereby reducing power consumption of the memory system 200.

Figure 15:
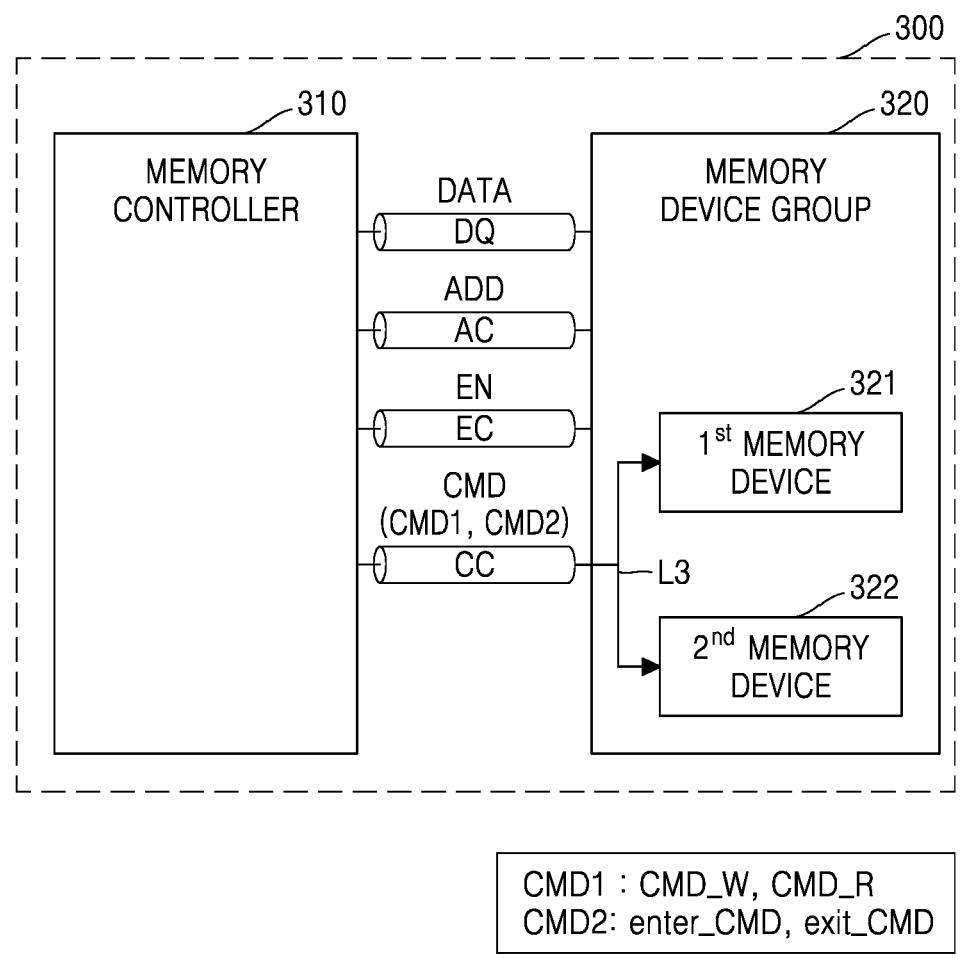
FIG. 15 is a diagram illustrating a memory system according to some embodiments.

FIG. 15 is a diagram illustrating a memory system 300 according to some embodiments. Repeated descriptions given with reference to FIG. 2 are omitted.

Referring to FIG. 15, the memory system 300 may correspond to the memory system 200 shown in FIG. 2. The memory system 300 may include a memory controller 310 and a memory device group 320. The memory device group 320 may include a first memory device 321 and a second memory device 322.

The memory controller 310 may correspond to the memory controller 210 shown in FIG. 2. The memory device group 320 may correspond to the memory device group 220 shown in FIG. 2. The first memory device 321 may correspond to the first memory device 221 shown in FIG. 2. The second memory device 322 may correspond to the second memory device 222 shown in FIG. 2.

The memory controller 310 may access data of the first memory device 321 and the second memory device 322 by transmitting the first command CMD1, the second command CMD2, and/or the enable signal EN to the first memory device 321 and the second memory device 322. The first command CMD1 may include commands for normal operations, such as a data read command and a data write command. The second command CMD2 may include a refresh enter command for performing a refresh operation and/or a refresh exit command for exiting a refresh operation.

The first memory device 321 and the second memory device 322 may receive a command generated by the memory controller 310, through the same line L3. Referring to FIG. 2, there is a difference in that the first memory device 221 and the second memory device 222 may receive a command generated by the memory controller 210, through different lines from each other.

For example, the first memory device 321 and the second memory device 322 may receive the first command CMD1 generated by the memory controller 310. This is described below in detail with reference to FIG. 17.

Conversely, the first memory device 321 and the second memory device 322 may receive the second command CMD2 generated by the memory controller 310. This is described below in detail with reference to FIG. 20.

When the first memory device 321 and the second memory device 322 are accessed, the first memory device 321 and the second memory device 322 may receive the first command CMD1, and when the first memory device 321 and the second memory device 322 are not accessed, the first memory device 321 and the second memory device 322 may receive the second command CMD2.

Figure 17:
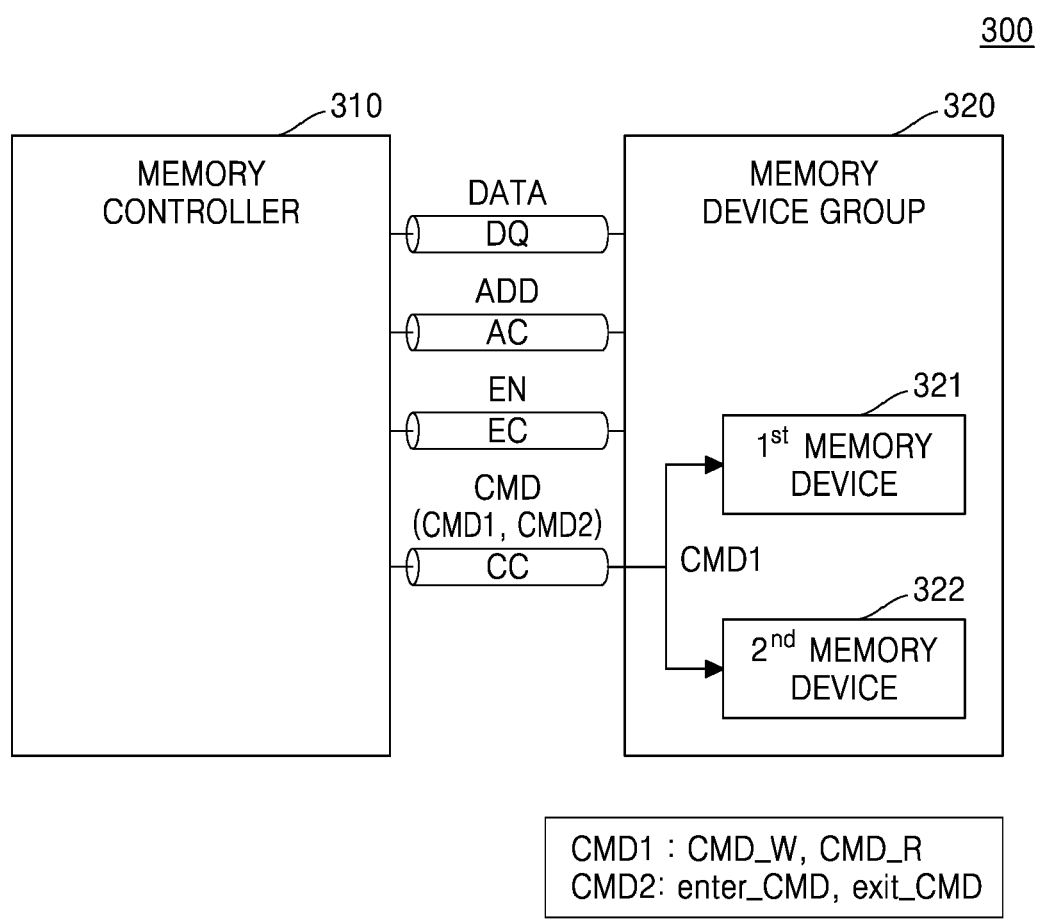
FIGS. 17, 18, and 19 are diagrams illustrating an operating method of a memory device when a first memory device and a second memory device receive a first command, according to an embodiment.
Figure 18:
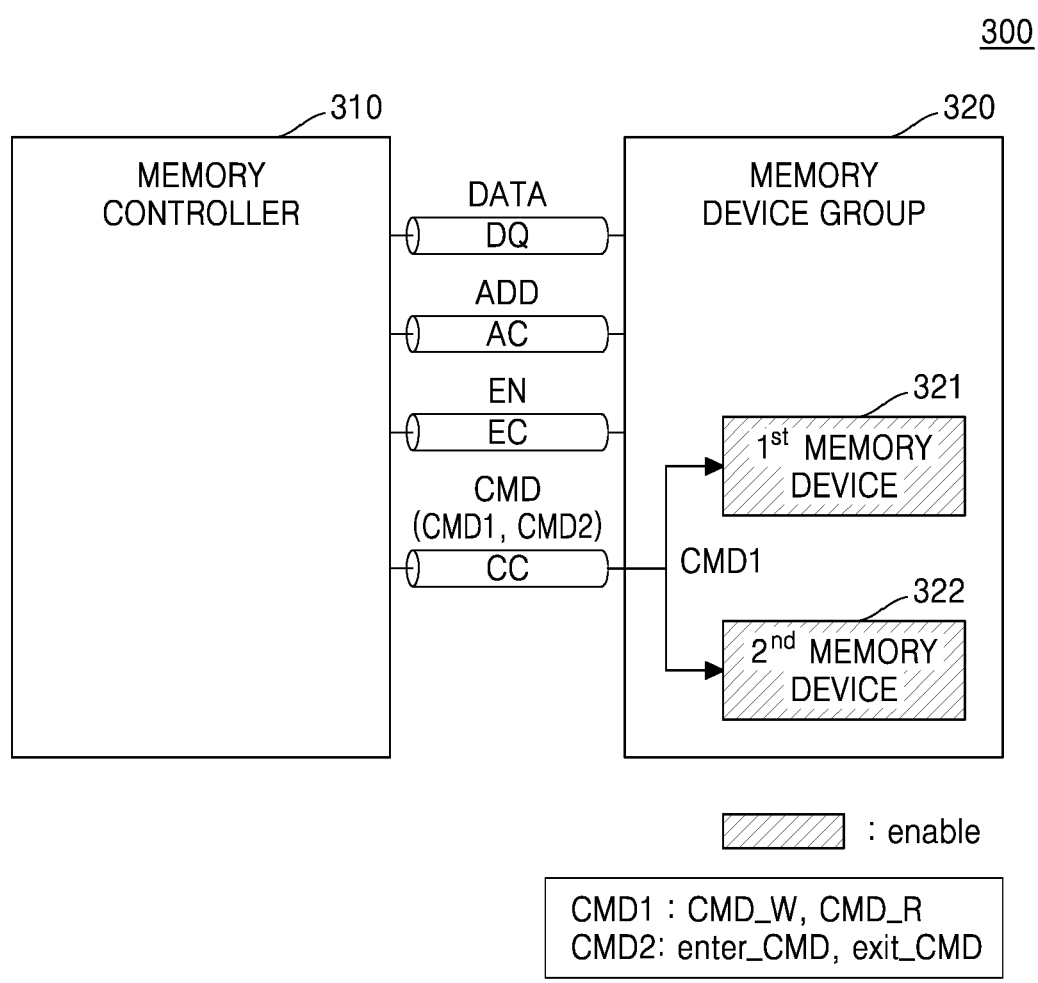
Figure 19:
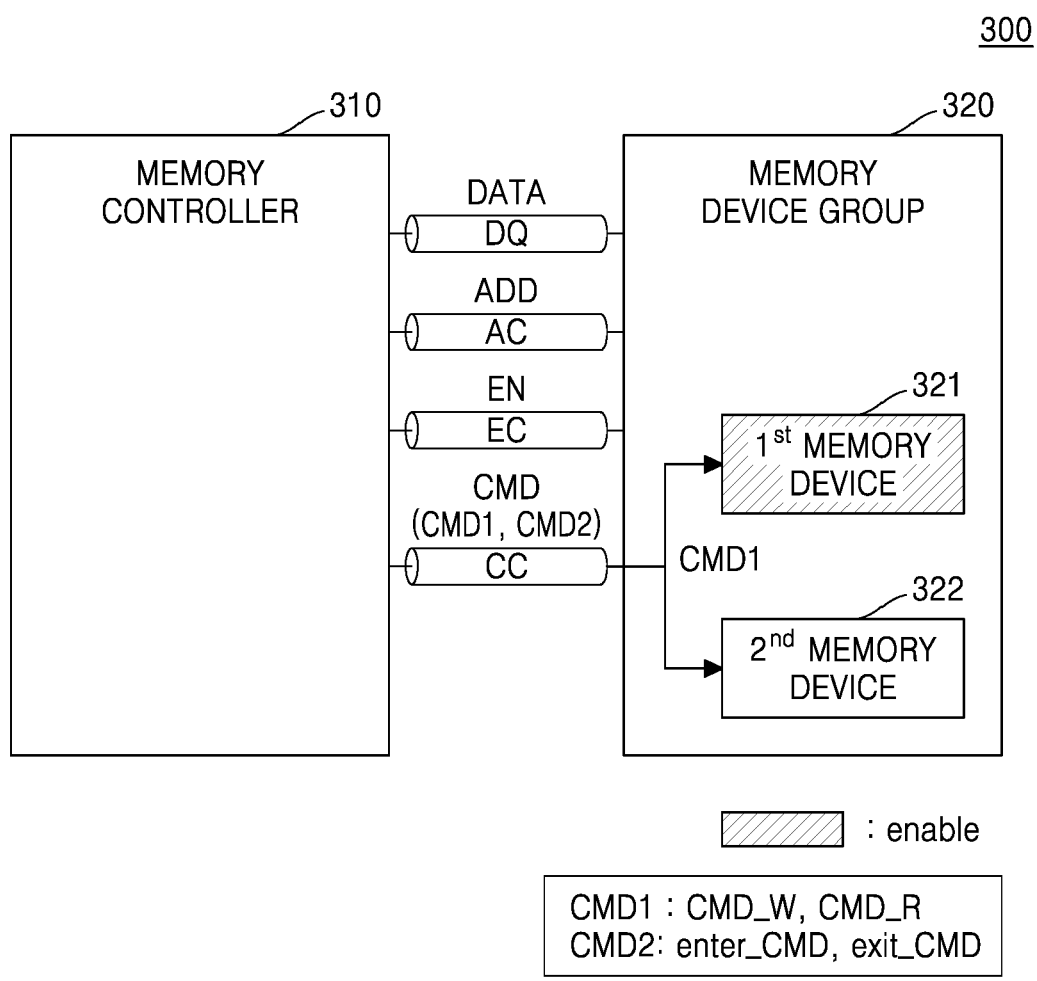

FIG. 16 is a table illustrating an operating method of the first memory device 321 and the second memory device 322, according to some embodiments. FIGS. 17 to 19 are diagrams illustrating an operating method of the first memory device 321 and the second memory device 322, when the first memory device 321 and the second memory device 322 receive the first command CMD1, according to an embodiment. Repeated descriptions given with reference to FIGS. 6 to 10 are omitted.

Referring to FIG. 16, each of the first memory device 321 and the second memory device 322 may perform a data read operation, a data write operation, a refresh operation mode enter operation, and a refresh operation mode exit operation, depending on the type of received command and the type of enable signal.

FIG. 16 illustrates an operating method of the first memory device 321 and the second memory device 322, when the first memory device 321 and the second memory device 322 receive the same command.

For example, when the first memory device 321 and the second memory device 322 are accessed, the first memory device 321 and the second memory device 322 may receive the first command CMD1. Conversely, when the first memory device 321 and the second memory device 322 are not accessed, the first memory device 321 and the second memory device 322 may receive the second command CMD2.

In addition, each of the first memory device 321 and the second memory device 322 may receive the enable signal EN. For example, when the first memory device 321 receives the enable signal EN, the first memory device 321 may be in an enabled state. Conversely, when the second memory device 322 does not receive the enable signal EN, the second memory device 322 may be in a disabled state.

Referring together to FIGS. 16 and 17, the first memory device 321 and the second memory device 322 may receive the first command CMD1 and the enable signal EN, which are generated by the memory controller 310, through the same line.

For example, referring to FIG. 18, when the first command CMD1 is the read command CMD_R and the enable signal EN is received, the first memory device 321 and the second memory device 322 may each perform a data read operation. When the first command CMD1 is the write command CMD_W and the enable signal EN is received, the first memory device 321 and the second memory device 322 may each perform a data write operation.

Referring to FIG. 19, although the first memory device 321 and the second memory device 322 may receive, through the same line, the first command CMD1 generated by the memory controller 310, only the first memory device 321 may receive the enable signal EN, and the second memory device 322 may not receive the enable signal EN.

For example, when the first command CMD1 is the read command CMD_R, the first memory device 321 may perform a data read operation. When the first command CMD1 is the write command CMD_W, the first memory device 321 may perform a data write operation. When the second memory device 322 does not receive the enable signal EN, the second memory device 322 may not perform a data read operation and/or a data write operation, regardless of whether the first command CMD1 is the read command CMD_R and/or the write command CMD_W.

Figure 20:
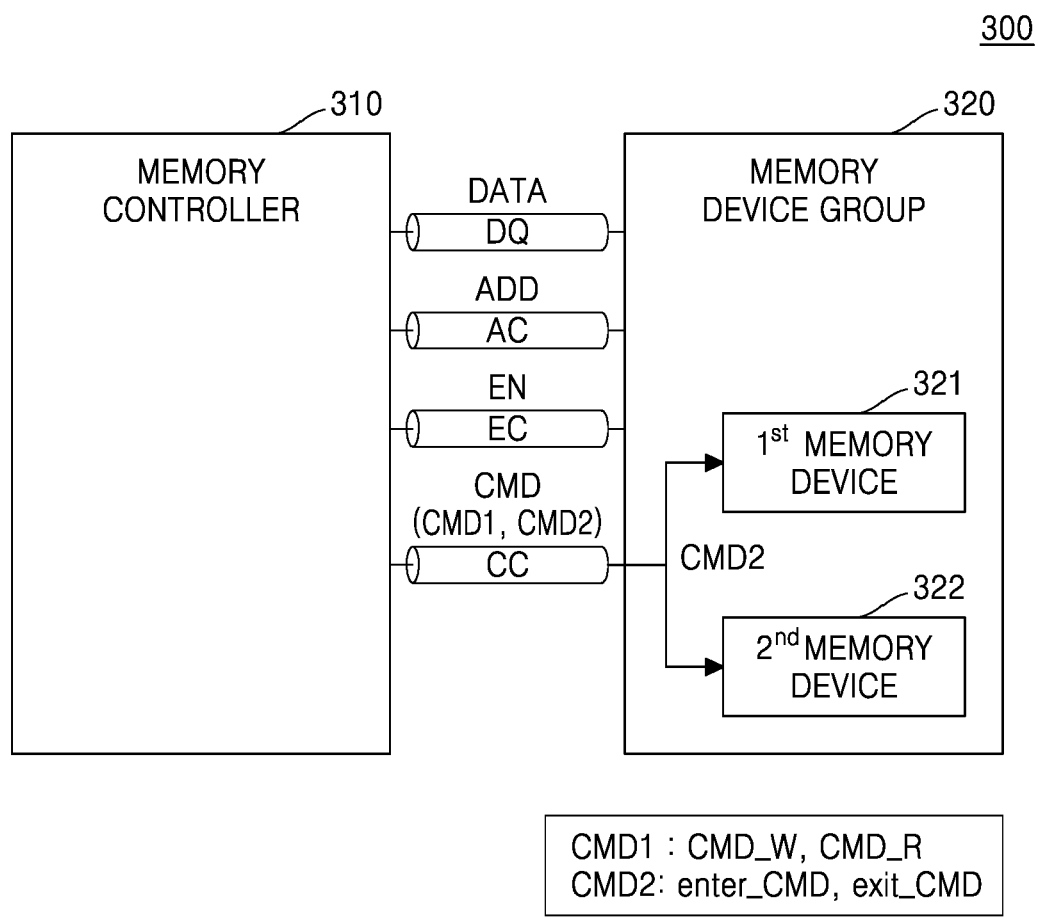
FIGS. 20, 21, and 22 are diagrams illustrating an operating method of a memory device when a first memory device and a second memory device receive a second command, according to an embodiment.
Figure 21:
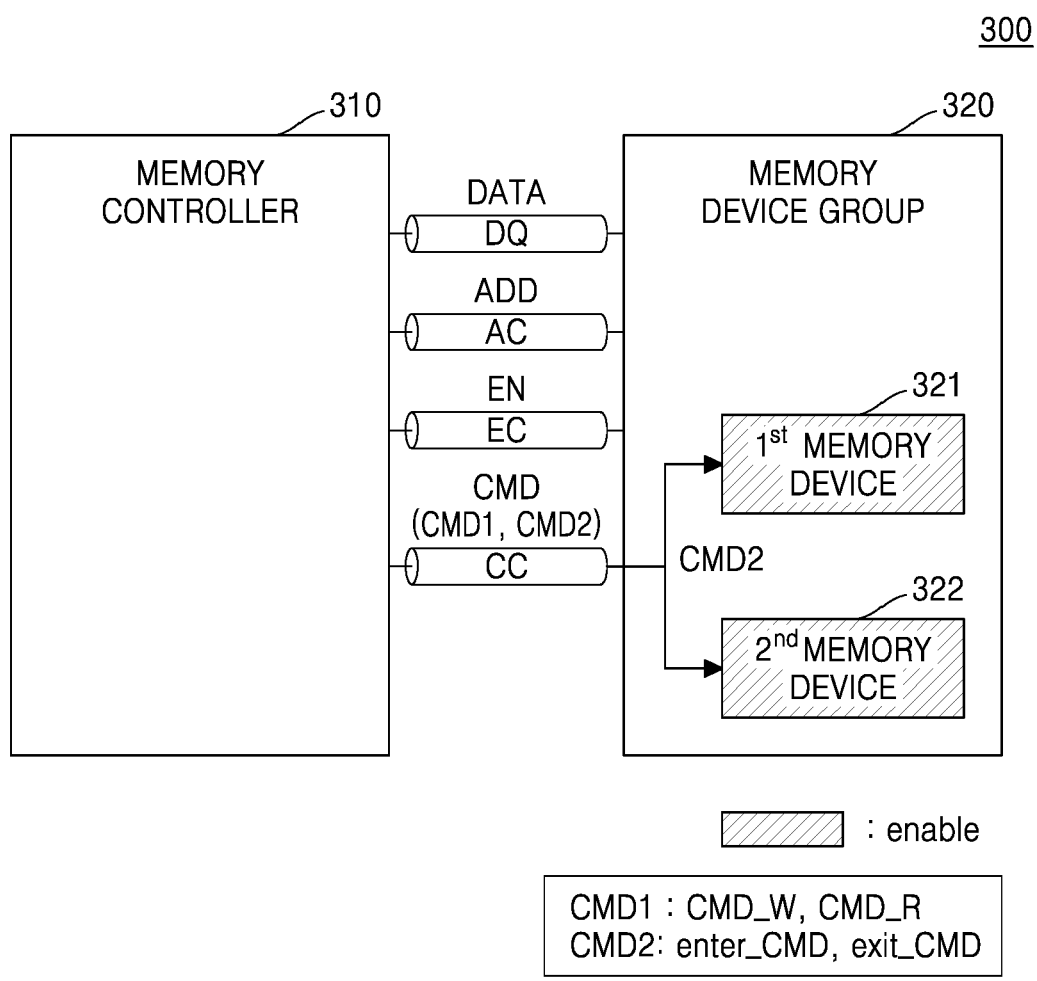
Figure 22:
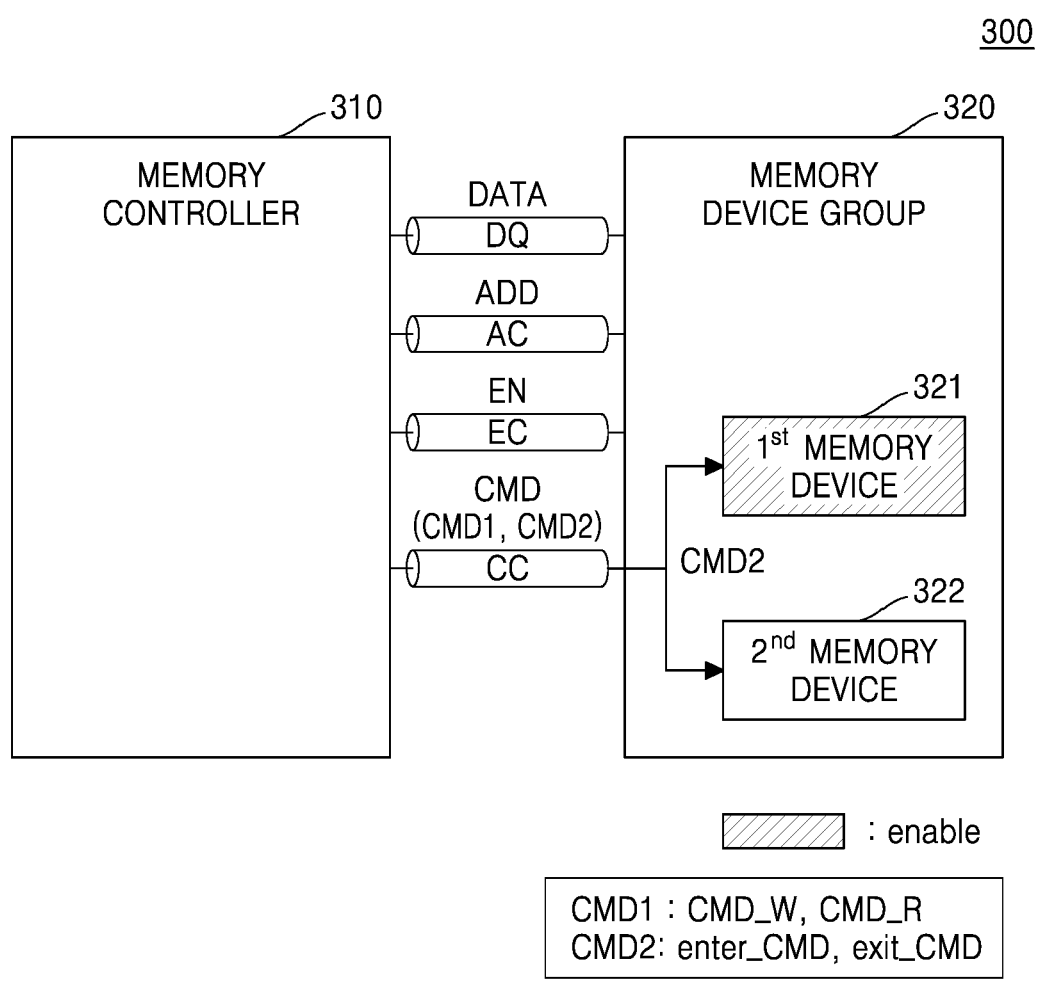

FIGS. 20 to 22 are diagrams illustrating an operating method of the first memory device 321 and the second memory device 322, when the first memory device 321 and the second memory device 322 receive the second command CMD2, according to an embodiment. Repeated descriptions given with reference to FIGS. 17 to 19 are omitted.

Referring to FIG. 20, the first memory device 321 and the second memory device 322 may receive the second command CMD2 generated by the memory controller 310, through the same line.

Referring to FIG. 21, when the second command CMD2 is the refresh enter command enter_CMD and the enable signal EN is received, the first memory device 321 and the second memory device 322 may each perform a refresh operation. When the second command CMD2 is the refresh exit command exit_CMD and the enable signal EN is received, the first memory device 321 and the second memory device 322 may each exit a refresh operation.

Referring to FIG. 22, although the first memory device 321 and the second memory device 322 may receive, through the same line, the second command CMD2 generated by the memory controller 310, only the first memory device 321 may receive the enable signal EN, and the second memory device 322 may not receive the enable signal EN.

For example, when the second command CMD2 is the refresh enter command enter_CMD, the first memory device 321 may perform a refresh operation. When the second command CMD2 is the refresh exit command exit_CMD, the first memory device 321 may exit a refresh operation. When the second memory device 322 does not receive the enable signal EN, the second memory device 322 may not perform and/or exit a refresh operation, regardless of whether the second command CMD2 is the refresh enter command enter_CMD and/or the refresh exit command exit_CMD.

Figure 23:
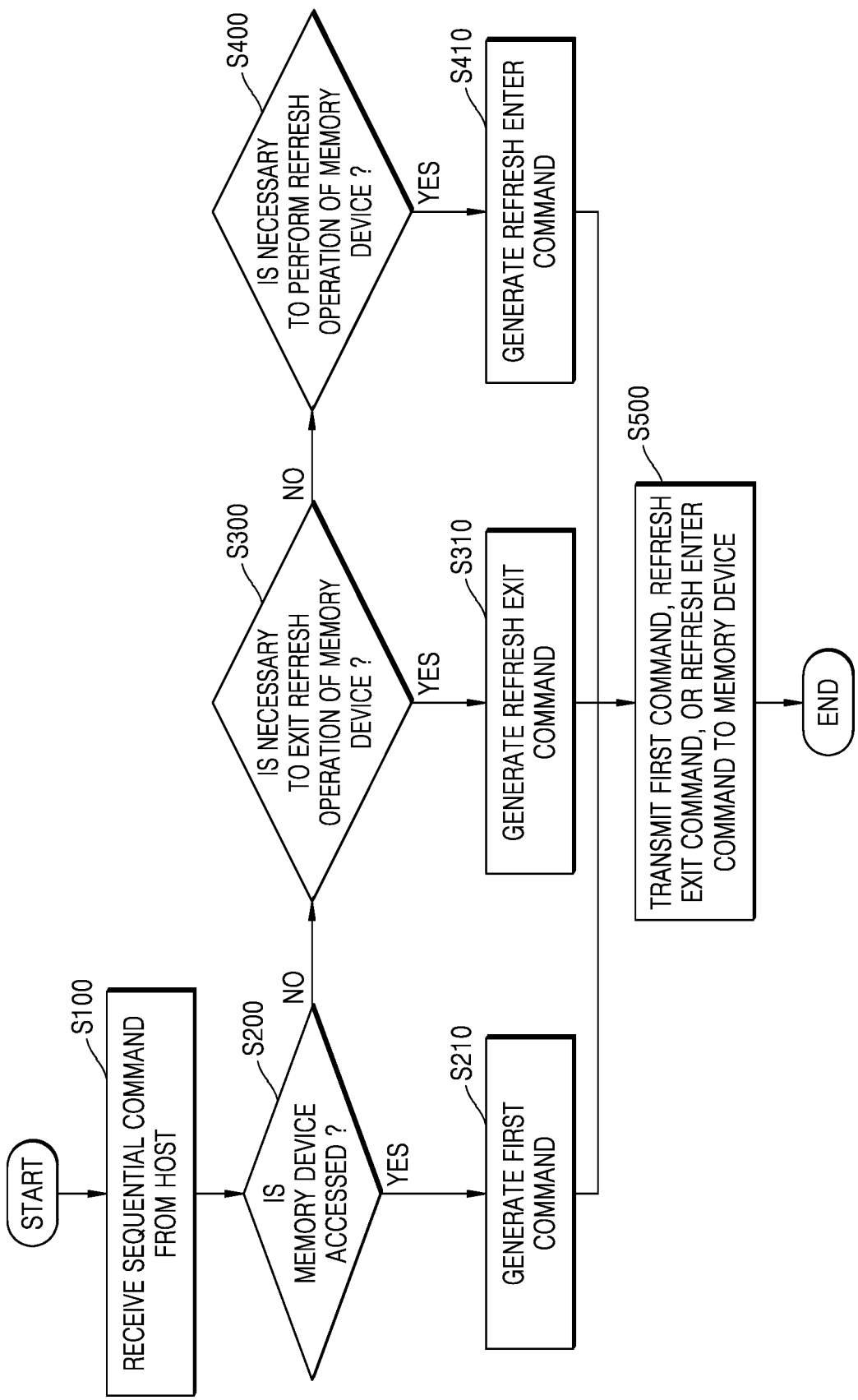
FIG. 23 is a flowchart illustrating an operating method of a memory system, according to an embodiment.

FIG. 23 is a flowchart illustrating an operating method of a memory system, according to an embodiment.

Referring to FIG. 23, the memory controller may receive a sequential command from a host (S100).

For example, referring to FIG. 1, the host 50 may transmit the sequential command Seq_CMD to the memory controller 110. The sequential command Seq_CMD refers to a command that may determine or indicate whether to access each of the first memory device 121 and the second memory device 122.

The memory controller may determine whether to access a memory device, based on the sequential command received from the host.

For example, referring to FIG. 2, the memory controller 210 may determine whether to access each of the first memory device 121 and the second memory device 122.

When the memory device is accessed (YES in S200), the memory controller may generate a first command, e.g., CMD1 (S210).

For example, referring to FIG. 2, the memory controller 210 may transmit the first command CMD1 to the accessed memory device. The first command CMD1 may include commands for normal operations, such as a data read command and a data write command.

When the memory device is not accessed (NO in S200), the memory controller may determine whether there is a need to exit a refresh operation of the memory device (S300). Whether the memory device needs to terminate the refresh operation is determined when the memory device does not receive the enable signal (EN) or when the enable signal (EN) is received and the refresh end command (exit_CMD) is received can be terminated.

When it is determined that there is a need to exit the refresh operation of the memory device (YES in S300), the memory controller may generate a refresh exit command (S310). Conversely, whether the memory device needs to perform a refresh operation may be performed when the memory device receives the enable signal EN and the refresh entry command enter_CMD.

For example, referring to FIG. 2, the memory controller 210 may transmit a refresh exit command to a non-accessed memory device. The refresh exit command may exit the refresh operation of the memory device.

When it is determined that there is no need to exit the refresh operation of the memory device (NO in S300), the memory controller may determine whether there is a need to perform the refresh operation of the memory device (S400).

When it is determined that there is a need to perform the refresh operation of the memory device (YES in S400), the memory controller may generate a refresh enter command (S410).

For example, referring to FIG. 2, the memory controller 210 may transmit a refresh enter command to the non-accessed memory device. The refresh enter command may perform the refresh operation of the memory device.

The memory controller may transmit, to the memory device, commands generated in respective operations S210, S310, and S410 (S500).

For example, the accessed memory device may perform a data read operation or a data write operation in response to receiving the first command. The non-accessed memory device may perform or exit a refresh operation in response to receiving a second command including the refresh enter command and the refresh exit command.

Each of operations S100, S200, S210, S300, S310, S400, S410, and S500 shown in FIG. 23 may be simultaneously performed by a plurality of memory devices or may be individually performed by each of the plurality of memory devices, but the inventive concept is not limited thereto.

According to the descriptions made above, a memory system according to the inventive concept may determine whether to access each memory device, in response to receiving a sequential command from a host, and may perform a refresh operation or a read or write operation on each memory device by determining the necessity of a refresh for each memory device, thereby reducing power consumption of the memory system.

Figure 24:
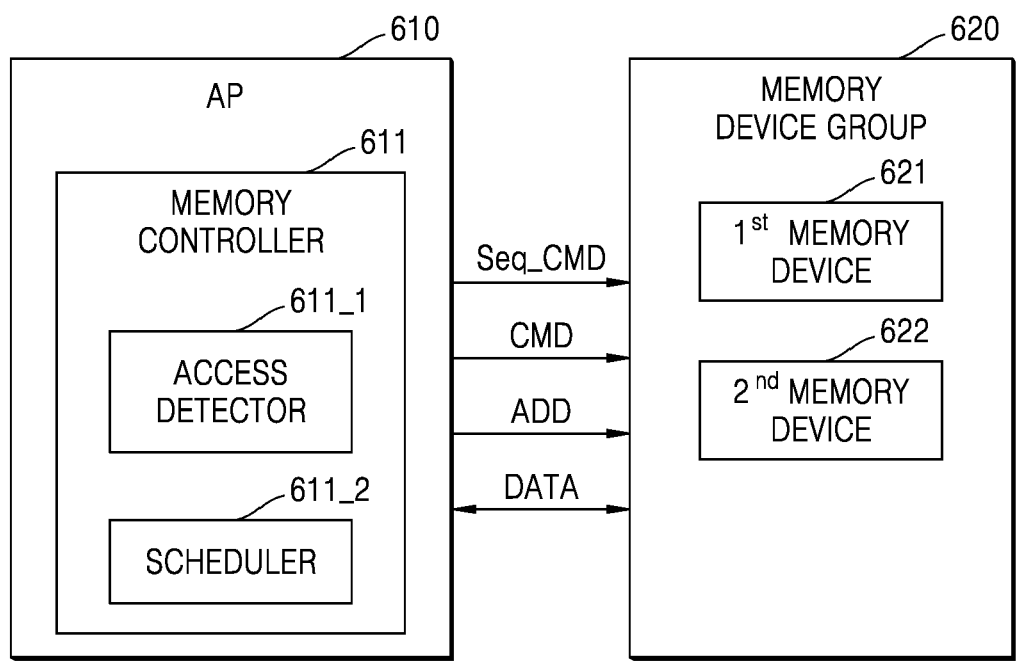
FIG. 24 is a diagram illustrating a data processing system according to an embodiment.

FIG. 24 is a diagram illustrating a data processing system 600 according to an embodiment.

Referring to FIG. 24, the data processing system 600 may include a memory controller 610 and a memory device group 620. The memory device group 620 may include a first memory device 621 and a second memory device 622 or may include n or more memory devices (where n is a natural number of 2 or more).

The data processing system 600 may include an AP 610, which operates as a host, and the memory device group 620. The memory device group 620 may include the first memory device 621, the second memory device 622, . . . , and an n-th memory device n, which are a plurality of memory devices. Various types of memory may be applied to or used to implement each of the plurality of memory devices. For example, DRAM according to the embodiments described above may be applied to the first memory device 621 and the second memory device 622, or various memory devices (for example, nonvolatile memory such as resistive memory) requiring refresh operations may be applied to the first memory device 621 and the second memory device 622. In addition, although not shown in FIG. 24, a memory device according to an embodiment may be implemented as embedded memory in the AP 610.

The AP 610 may be implemented by a system-on-chip (SoC). The SoC may include a system bus (not shown), to which a protocol having a certain standard bus specification is applied, and may include various types of intellectual property (IP) connected to the system bus. As the standard specification of the system bus, an Advanced Microcontroller Bus Architecture (AMBA) protocol of Advanced RISC Machine (ARM) company may be used. Bus types of the AMBA protocol may include Advanced High-Performance Bus (AHB), Advanced Peripheral Bus (APB), Advanced extensible Interface (AXI), AXI4, AXI Coherency Extensions (ACE), and the like. In addition, other types of protocols, such as uNetwork of SONICs Inc., CoreConnect of IBM, or Open Core Protocol of OCP-IP, may be used.

The AP 610 may include a memory control module or circuit 611 for controlling the first memory device 621 and the second memory device 622, and the memory control module 611 may perform the functions of the memory controller according to the embodiments described above.

The memory control module 611 may transmit the command CMD, the address ADD, and the like to the first memory device 621 and the second memory device 622 to control a memory operation. In addition, data DATA may be transmitted and received between the AP 610 and each of the first memory device 621 and the second memory device 622, according to the memory operation such as data access.

Furthermore, according to an embodiment, the memory control module 611 may include an access detector 611_1 and a scheduler 611_2.

The access detector 611_1 may detect (determine) whether to access each of the first memory device 621 and the second memory device 622. The access detector 611_1 may generate a first command according to an access request from a host. The first command may include a write command, which may write data to a memory device, and a read command, which may read data from a memory device. The access detector 611_1 may generate a second command according to a non-access request. The second command may include a refresh enter command, which may perform a refresh operation of a memory device, and a refresh exit command, which may exit a refresh operation of a memory device.

The scheduler 611_2 may schedule the first command and the second command. The scheduler 611_2 may adjust output timings of the first command and the second command.

Figure 25:
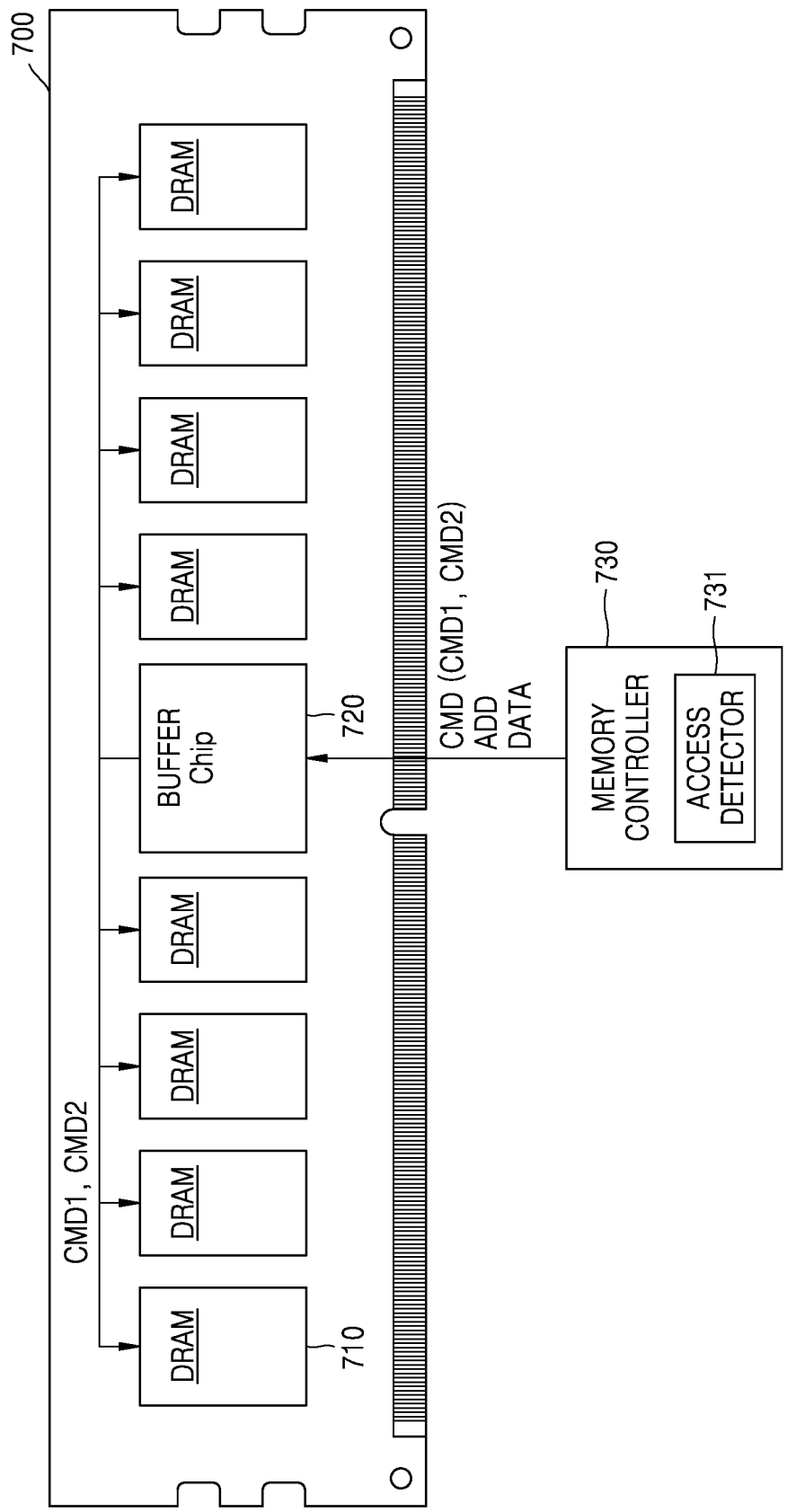
FIG. 25 is a diagram illustrating a memory module according to some embodiments.

FIG. 25 is a diagram illustrating a memory module 700 according to some embodiments.

Referring to FIG. 25, the memory module 700 may include a plurality of memory chips 710 and a buffer chip 720. The memory module 700 may include various types of memory modules, for example, Load Reduced Dual In-Line Memory Module (LR-DIMM) or other memory modules. The memory module 700 may be connected to a memory controller 730 via the buffer chip 720 and may receive the command CMD, the address ADD, the data DATA, the enable signal EN, and the like.

The memory controller 730 may include an access detector 731. The access detector 731 may detect (determine)

whether to access each of the memory chips 710. The access detector 731 may generate the first command CMD1 according to an access request from a host. The first command CMD1 may include a write command, which may write data to a memory device, and a read command, which may read data from a memory device. The access detector 731 may generate the second command CMD2 according to a non-access request. The second command CMD2 may include a refresh enter command, which may perform a refresh operation of a memory device, and a refresh exit command, which may exit a refresh operation of a memory device.

The memory controller 730 may further include a scheduler. The scheduler may schedule output of the first command CMD1 and the second command CMD2. The scheduler may adjust output timings of the first command CMD1 and the second command CMD2.

The buffer chip 720 may control a refresh operation of each of the memory chips 710, according to the command CMD and the address ADD from the memory controller 730. In addition, according to the embodiments described above, the buffer chip 720 may manage a refresh operation for rows of each of the memory chips 710.

According to some embodiments, each of the memory chips 710 may determine whether to access each of the memory chips 710 is accessed, in response to receiving a sequential command from a host, and may perform a refresh operation or a read or write operation on each memory device by determining the necessity of a refresh for each of the memory chips 710, thereby reducing power consumption of the memory chips 710.

Figure 26:
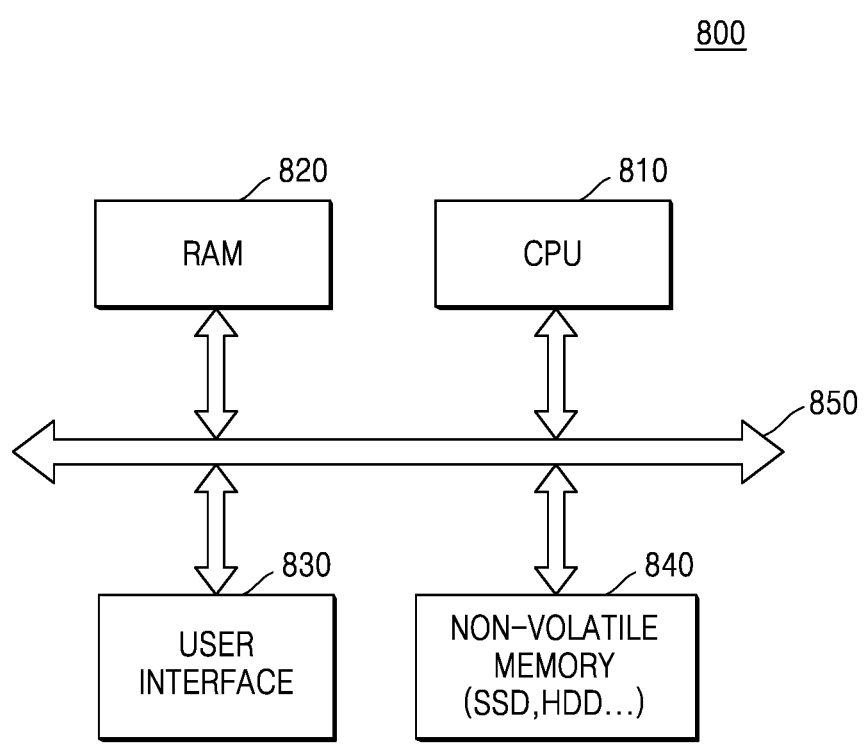
FIG. 26 is a block diagram illustrating a computing system in which a memory system according to an embodiment is mounted.

FIG. 26 is a block diagram illustrating a computing system 800 in which a memory system according to an embodiment is mounted.

A memory device according to the inventive concept may be mounted as RAM 820 in the computing system 800, such as a mobile device or a desktop computer. One of the embodiments described above may be applied to the memory device mounted as the RAM 820. In addition, a memory controller according to the inventive concept may be provided in the RAM 820 or may be implemented as a memory controller module in a CPU 810.

The computing system 800 according to an embodiment includes the CPU 810, the RAM 820, a user interface 830, and nonvolatile memory 840, and these components may each be electrically connected to a bus 850. As the nonvolatile memory 840, a mass storage device, such as a solid-state drive (SSD) or a hard disk drive (HDD), may be used.

As a memory device (or a memory system) according to an embodiment is applied to the computing system 800, the memory controller, which is provided in the RAM 820, and/or the memory controller module, which may be provided in the CPU 810, may determine whether to access each memory device, in response to receiving a sequential command from a host, according to the embodiments described above, and may perform a refresh operation or a read or write operation on each memory device by determining the necessity of a refresh for each memory device, thereby reducing power consumption of the computing system 800.

While the inventive concept has been particularly shown and described with reference to embodiments thereof, it will be understood that various changes in form and details may be made therein without departing from the scope of the following claims.

What is claimed is:

1. A memory system comprising:
a memory controller configured to receive a single host command from a host and generate a normal command, a refresh command, a first enable signal and a second enable signal in response to receiving the host command;
a first memory device configured to receive the first enable signal from the memory controller; and
a second memory device configured to receive the second enable signal from the memory controller,
wherein the host command indicates whether to access each of the first memory device and the second memory device and whether to refresh each of the first memory device and the second memory device,
the memory controller is further configured to:
determine whether to access each of the first memory device and the second memory device based on the host command;
determine whether to refresh each of the first memory device and the second memory device based on the host command;
transmit the first enable signal to the first memory device to enable the first memory device and the normal command to the first memory device responsive to determining that the first memory device is to be accessed; and
transmit the second enable signal to the second memory device to enable the second memory device and the refresh command to the second memory device responsive to determining that the second memory device is to be refreshed,
the first memory device performs a normal operation in an enable state based on the normal command and the first enable signal, and
the second memory device performs a refresh operation in an enable state based on the refresh command and the second enable signal.

2. The memory system of claim 1, wherein the memory controller comprises:
an access detector configured to determine whether to access each of the first memory device and the second memory device, based on the host command received from the host; and
a scheduler configured to schedule transmission of the normal command and the refresh command.

3. The memory system of claim 2, wherein the normal command comprises one of a read command or a write command, and
the refresh command comprises one of a refresh enter command or a refresh exit command.

4. The memory system of claim 3, wherein the first memory device is further configured to receive, through a first signal line, the normal command generated by the memory controller, and
the second memory device is further configured to receive, through a second signal line that is different from the first signal line, the refresh command generated by the memory controller.

5. The memory system of claim 3, wherein the first memory device is further configured to perform a read operation in response to receiving the read command and the first enable signal, and
the second memory device is further configured to perform the refresh operation in response to receiving the refresh enter command and the second enable signal.

6. The memory system of claim 3, wherein the first memory device is further configured to perform a read operation in response to receiving the read command and the first enable signal, and
the second memory device is further configured to exit the refresh operation in response to receiving the refresh exit command and the second enable signal.

7. The memory system of claim 3, wherein the first memory device is further configured to perform a write operation in response to receiving the write command and the first enable signal, and
the second memory device is further configured to perform the refresh operation in response to receiving the refresh enter command and the second enable signal.

8. The memory system of claim 3, wherein the first memory device is further configured to perform a write operation in response to receiving the write command and the first enable signal, and
the second memory device is further configured to exit the refresh operation in response to receiving the refresh exit command and the second enable signal.

9. The memory system of claim 2, wherein the scheduler is further configured to simultaneously transmit the normal command or the refresh command to the first memory device and the second memory device.

10. The memory system of claim 2, wherein the scheduler is further configured to sequentially transmit the normal command or the refresh command to the first memory device and the second memory device.

11. An operating method of a memory system, the operating method comprising:
receiving, from a host, a single host command to refresh and access a plurality of memory devices;
determining whether to access at least one memory device among a first memory device and a second memory device and whether to refresh at least one memory device among the first memory device and the second memory device, based on the host command;
generating a normal command, a refresh command, a first enable signal and a second enable signal, based on the host command;
transmitting the normal command and the first enable signal to the first memory device, responsive to determining that the first memory device is to be accessed;
transmitting the refresh command and the second enable signal, to the second memory device, responsive to determining that the second memory device is to be refreshed;
performing, by the first memory device, a normal operation in an enable state based on the normal command and the first enable signal; and
performing, by the second memory device, a refresh operation in an enable state based on the refresh command and the second enable signal.

12. The operating method of claim 11, further comprising:
receiving, by the first memory device, the normal command through a first signal line; and
receiving, by the second memory device, the refresh command through a second signal line that is different from the first signal line.

13. The operating method of claim 11, wherein the first memory device and the second memory device receive the normal command and the refresh command, which is generated by a memory controller, through the same signal line.

14. The operating method of claim 11, wherein the first memory device performs a read operation in response to receiving a read command included in the normal command and the first enable signal.

15. The operating method of claim 11, wherein the first memory device performs a write operation in response to receiving a write command included in the normal command and the first enable signal.

16. The operating method of claim 11, wherein the second memory device performs the refresh operation in response to receiving the refresh enter command included in the refresh command and the second enable signal.

17. The operating method of claim 11, wherein the second memory device exits the refresh operation in response to receiving a refresh exit command included in the refresh command and the second enable signal.

18. An operating method a memory system, the operating method comprising:
receiving, from a host, a single host command to refresh and access a plurality of memory devices;
determining whether to access at least one memory device among a first memory device and a second memory device and whether to refresh at least one memory device among the first memory device and the second memory device, based on the host command;
generating a first command, a second command, a first enable signal to enable the first memory device and a second enable signal to enable the second memory device, based on the host command;
transmitting the first command and the first enable signal to the first memory device, responsive to determining that the first memory device is to be accessed;
transmitting the second command and the second enable signal to the second memory device, responsive to determining that the second memory device is to be refreshed;
performing, by the first memory device, a normal operation based on the first command and the first enable signal; and
performing, by the second memory device, a refresh operation based on the second command and the second enable signal.

19. The operating method of claim 18, further comprising:
receiving, by the first memory device, the first command through a first signal line; and
receiving, by the second memory device, the second command through a second signal line that is different from the first line.

20. The operating method of claim 18, further comprising receiving, by the first memory device and the second memory device, the first command or the second command through the same signal line.

* * * * *